(12) United States Patent
Lin et al.

(10) Patent No.: US 10,943,873 B2
(45) Date of Patent: Mar. 9, 2021

(54) SEMICONDUCTOR DEVICE STRUCTURE COMPRISING A PLURALITY OF METAL OXIDE FIBERS AND METHOD FOR FORMING THE SAME

(71) Applicant: Taiwan Semiconductor Manufacturing Company, Ltd., Hsinchu (TW)

(72) Inventors: Jing-Cheng Lin, Hsinchu (TW); Chen-Hua Yu, Hsinchu (TW); Szu-Wei Lu, Hsinchu (TW); Yen-Yao Chi, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/213,788

(22) Filed: Dec. 7, 2018

(65) Prior Publication Data

US 2019/0109098 A1    Apr. 11, 2019

Related U.S. Application Data

(63) Continuation of application No. 15/362,654, filed on Nov. 28, 2016, now Pat. No. 10,163,817, which is a
(Continued)

(51) Int. Cl.
*H01L 23/00* (2006.01)
*H01L 21/02* (2006.01)
(Continued)

(52) U.S. Cl.
CPC ...... *H01L 23/562* (2013.01); *H01L 21/02068* (2013.01); *H01L 21/02118* (2013.01);
(Continued)

(58) Field of Classification Search
CPC .......... H01L 23/481; H01L 23/523228; H01L 21/76888; H01L 23/498–49894;
(Continued)

(56) References Cited

U.S. PATENT DOCUMENTS 4,234,458 A    11/1980 Antos
4,946,518 A    8/1990 Spanjer et al.
(Continued)

FOREIGN PATENT DOCUMENTS

CN    100475005 C    4/2009
CN    102548248 A    7/2012
(Continued)

OTHER PUBLICATIONS

Fauty, Joseph et al., "Mold Compound Adhesion to Bare Copper Lead Frames—Effect of Laser Texturing," The International Journal of Microcircuits and Electronic Packaging, vol. 25, No. 1, 2002, 32 pages.

*Primary Examiner* — Kevin Parendo
(74) *Attorney, Agent, or Firm* — Slater Matsil, LLP

(57) ABSTRACT

A semiconductor device structure is provided. The semiconductor device structure includes a substrate. The semiconductor device structure includes a conductive structure over the substrate. The semiconductor device structure includes first metal oxide fibers over the conductive structure. The semiconductor device structure includes a dielectric layer over the substrate and covering the conductive structure and the first metal oxide fibers. The dielectric layer fills gaps between the first metal oxide fibers.

20 Claims, 23 Drawing Sheets

Related U.S. Application Data continuation of application No. 14/970,962, filed on Dec. 16, 2015, now Pat. No. 9,508,664.

(51) Int. Cl.

| | |
|---|---|
| *H01L 23/31* | (2006.01) |
| *H01L 21/56* | (2006.01) |
| *H01L 21/768* | (2006.01) |
| *H01L 21/3205* | (2006.01) |
| *H01L 21/48* | (2006.01) |
| *H01L 23/528* | (2006.01) |
| *H01L 23/538* | (2006.01) |
| *H01L 25/10* | (2006.01) |
| *H01L 33/62* | (2010.01) |
| *H01L 23/532* | (2006.01) |
| *H01L 25/00* | (2006.01) |
| *H01L 23/525* | (2006.01) |

(52) U.S. Cl.
CPC .. *H01L 21/02175* (2013.01); *H01L 21/02244* (2013.01); *H01L 21/02252* (2013.01); *H01L 21/02255* (2013.01); *H01L 21/02304* (2013.01); *H01L 21/32051* (2013.01); *H01L 21/486* (2013.01); *H01L 21/4853* (2013.01); *H01L 21/4857* (2013.01); *H01L 21/4864* (2013.01); *H01L 21/56* (2013.01); *H01L 21/561* (2013.01); *H01L 21/565* (2013.01); *H01L 21/568* (2013.01); *H01L 21/76832* (2013.01); *H01L 21/76834* (2013.01); *H01L 21/76888* (2013.01); *H01L 21/76898* (2013.01); *H01L 23/3114* (2013.01); *H01L 23/3121* (2013.01); *H01L 23/3128* (2013.01); *H01L 23/528* (2013.01); *H01L 23/5383* (2013.01); *H01L 23/5384* (2013.01); *H01L 23/5386* (2013.01); *H01L 23/5389* (2013.01); *H01L 23/53228* (2013.01); *H01L 23/53295* (2013.01); *H01L 24/08* (2013.01); *H01L 24/11* (2013.01); *H01L 24/13* (2013.01); *H01L 24/19* (2013.01); *H01L 24/20* (2013.01); *H01L 24/32* (2013.01); *H01L 25/105* (2013.01); *H01L 25/50* (2013.01); *H01L 33/62* (2013.01); *H01L 23/3107* (2013.01); *H01L 23/525* (2013.01); *H01L 24/16* (2013.01); *H01L 24/73* (2013.01); *H01L 24/92* (2013.01); *H01L 2224/0231* (2013.01); *H01L 2224/0233* (2013.01); *H01L 2224/0401* (2013.01); *H01L 2224/04105* (2013.01); *H01L 2224/05005* (2013.01); *H01L 2224/05124* (2013.01); *H01L 2224/05144* (2013.01); *H01L 2224/05147* (2013.01); *H01L 2224/05155* (2013.01); *H01L 2224/05164* (2013.01); *H01L 2224/05184* (2013.01); *H01L 2224/05558* (2013.01); *H01L 2224/05624* (2013.01); *H01L 2224/05644* (2013.01); *H01L 2224/05647* (2013.01); *H01L 2224/05655* (2013.01); *H01L 2224/05664* (2013.01); *H01L 2224/05684* (2013.01); *H01L 2224/1183* (2013.01); *H01L 2224/12105* (2013.01); *H01L 2224/13024* (2013.01); *H01L 2224/13025* (2013.01); *H01L 2224/13101* (2013.01); *H01L 2224/13111* (2013.01); *H01L 2224/16225* (2013.01); *H01L 2224/16227* (2013.01); *H01L 2224/19* (2013.01); *H01L 2224/32225* (2013.01); *H01L 2224/48227* (2013.01); *H01L 2224/48247* (2013.01); *H01L 2224/73204* (2013.01); *H01L 2224/73265* (2013.01); *H01L 2224/73267* (2013.01); *H01L 2224/83005* (2013.01); *H01L 2224/92125* (2013.01); *H01L 2224/92244* (2013.01); *H01L 2225/1035* (2013.01); *H01L 2225/1041* (2013.01); *H01L 2225/1058* (2013.01); *H01L 2924/01029* (2013.01); *H01L 2924/0541* (2013.01); *H01L 2924/15311* (2013.01); *H01L 2924/181* (2013.01)

(58) Field of Classification Search
CPC .............................. H01L 23/538–5389; H01L 2225/06572–06575; H01L 21/02244
See application file for complete search history.

(56) References Cited

U.S. PATENT DOCUMENTS

| | | | |
|---|---|---|---|
| 8,314,004 | B2 | 11/2012 | Matsumoto et al. |
| 8,624,280 | B2 | 1/2014 | Won et al. |
| 8,828,100 | B1 | 9/2014 | Warner et al. |
| 9,508,664 | B2 | 11/2016 | Lin et al. |
| 9,859,222 | B1 | 1/2018 | Kim et al. |
| 10,079,159 | B2 | 9/2018 | Lin et al. |
| 2002/0000657 | A1 | 1/2002 | Wen et al. |
| 2005/0100720 | A1* | 5/2005 | Shirai .................... H05K 3/421 |
| | | | 428/209 |
| 2005/0285230 | A1 | 12/2005 | Kim |
| 2006/0003579 | A1 | 1/2006 | Sir |
| 2007/0020946 | A1 | 1/2007 | Tanaka |
| 2007/0065651 | A1 | 3/2007 | Glatkowski et al. |
| 2008/0070054 | A1 | 3/2008 | Sumita et al. |
| 2008/0216921 | A1* | 9/2008 | Kwan ................. H01L 21/4821 |
| | | | 148/95 |
| 2008/0236879 | A1 | 10/2008 | Kohara et al. |
| 2008/0237879 | A1 | 10/2008 | Yang |
| 2008/0241682 | A1 | 10/2008 | Huang et al. |
| 2009/0105335 | A1 | 4/2009 | Luchini et al. |
| 2009/0151972 | A1 | 6/2009 | Potter |
| 2009/0311166 | A1 | 12/2009 | Hart et al. |
| 2010/0009240 | A1 | 1/2010 | Fly et al. |
| 2010/0012964 | A1 | 1/2010 | Copic et al. |
| 2010/0071940 | A1 | 3/2010 | Ejiri et al. |
| 2010/0255323 | A1 | 10/2010 | Nakamura et al. |
| 2011/0254160 | A1* | 10/2011 | Tsai .................. H01L 21/76898 |
| | | | 257/738 |
| 2011/0272796 | A1 | 11/2011 | Eaton et al. |
| 2011/0287926 | A1 | 11/2011 | Lalman et al. |
| 2012/0153444 | A1 | 6/2012 | Haga et al. |
| 2012/0168212 | A1* | 7/2012 | Ha ....................... H05K 1/0284 |
| | | | 174/257 |
| 2013/0022871 | A1 | 1/2013 | Traulsen et al. |
| 2013/0248877 | A1 | 9/2013 | Fujikane et al. |
| 2013/0308175 | A1 | 11/2013 | Yasui et al. |
| 2014/0009514 | A1 | 1/2014 | Abe et al. |
| 2014/0072700 | A1 | 3/2014 | Kim et al. |
| 2014/0131858 | A1 | 5/2014 | Pan et al. |
| 2014/0252600 | A1 | 9/2014 | Chang et al. |
| 2014/0252647 | A1 | 9/2014 | Huang et al. |
| 2014/0264853 | A1 | 9/2014 | Lin et al. |
| 2014/0332966 | A1 | 11/2014 | Xiu et al. |
| 2014/0353648 | A1 | 12/2014 | Abe et al. |
| 2014/0367841 | A1 | 12/2014 | Huang et al. |
| 2015/0037980 | A1 | 2/2015 | Rha et al. |
| 2015/0200181 | A1 | 7/2015 | Haga et al. |
| 2015/0382461 | A1 | 12/2015 | Ha et al. |
| 2016/0064348 | A1* | 3/2016 | Pan ....................... H01L 23/147 |
| | | | 257/737 |
| 2016/0260695 | A1* | 9/2016 | Chung .................... H01L 25/18 |
| 2017/0040531 | A1 | 2/2017 | Chung et al. |
| 2018/0012862 | A1 | 1/2018 | Yu et al. |
| 2018/0082921 | A1 | 3/2018 | Grassmann et al. |

(56) References Cited

U.S. PATENT DOCUMENTS

| | | |
|---|---|---|
| 2018/0096919 A1 | 4/2018 | Roth et al. |
| 2019/0157531 A1 | 5/2019 | Moon et al. |

FOREIGN PATENT DOCUMENTS

| | | |
|---|---|---|
| CN | 103972191 A | 8/2014 |
| JP | 11233545 A | 8/1999 |
| JP | 2001203448 A | 7/2001 |
| JP | 2002076618 A | 3/2002 |
| JP | 2004022699 A | 1/2004 |
| JP | 2005071965 A | 3/2005 |
| JP | 2006059676 A | 3/2006 |
| JP | 2006270031 A | 10/2006 |
| JP | 2007043084 A | 2/2007 |
| JP | 2010062175 A | 3/2010 |
| JP | 2010212492 A | 9/2010 |
| JP | 2011114233 A | 6/2011 |
| KR | 1020140061959 A | 5/2014 |

* cited by examiner

US 10,943,873 B2

SEMICONDUCTOR DEVICE STRUCTURE COMPRISING A PLURALITY OF METAL OXIDE FIBERS AND METHOD FOR FORMING THE SAME

PRIORITY CLAIM AND CROSS-REFERENCE

This application is a continuation of U.S. patent application Ser. No. 15/362,654, filed on Nov. 28, 2016, and entitled "Semiconductor Device Structure Comprising a Plurality of Metal Oxide Fibers and Method for Forming the Same," which is a continuation of U.S. patent application Ser. No. 14/970,962, filed on Dec. 16, 2015, and entitled "Semiconductor Device Structure Comprising a Plurality of Metal Oxide Fibers and Method for Forming the Same," now U.S. Pat. No. 9,508,664 B1, issued on Nov. 29, 2016, which applications are incorporated herein by reference.

This application is related to the following co-pending and commonly assigned patent application: U.S. patent application Ser. No. 14/971,132, filed on Dec. 16, 2015, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements.

One of the important drivers for increased performance in semiconductor devices is the higher levels of integration of circuits. This is accomplished by miniaturizing or shrinking device sizes on a given chip. Tolerance plays an important role in being able to shrink the dimensions of a chip.

However, although existing manufacturing processes for forming semiconductor devices have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
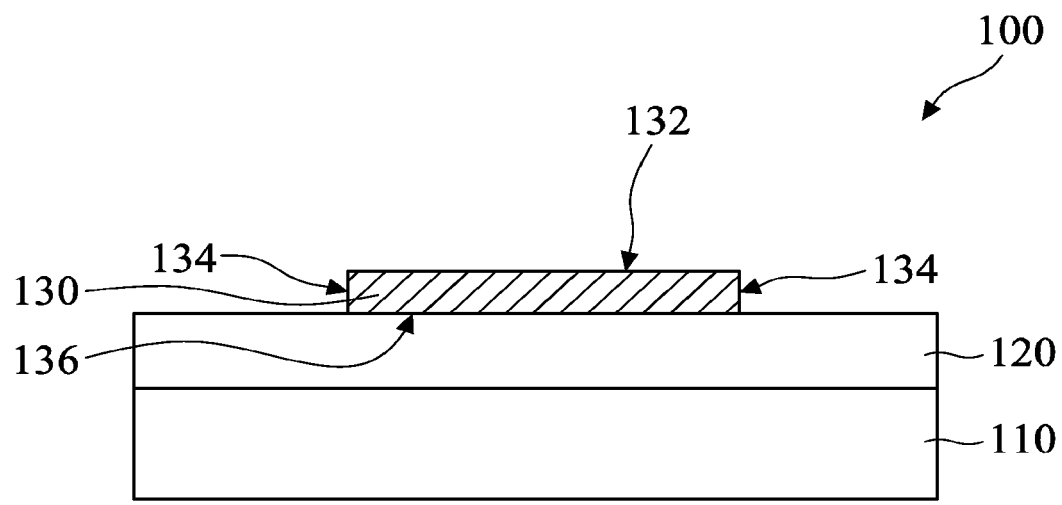
FIGS. 1A-1H are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1H are cross-sectional views of various stages of a process for forming a semiconductor device structure 100, in accordance with some embodiments. As shown in FIG. 1A, a substrate 110 is provided, in accordance with some embodiments. The substrate 110 includes a semiconductor substrate, in accordance with some embodiments. The semiconductor substrate includes a semiconductor wafer (e.g., a silicon wafer) or a chip, in accordance with some embodiments. Alternatively or additionally, the substrate 110 may include elementary semiconductor materials, compound semiconductor materials, and/or alloy semiconductor materials.

Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

As shown in FIG. 1A, a dielectric layer 120 is formed over the substrate 110, in accordance with some embodiments. The dielectric layer 120 includes polymer (e.g., polyimide), oxide (e.g., $SiO_2$), borophosphosilicate glass (BPSG), spin on glass (SOG), undoped silicate glass (USG), fluorinated silicate glass (FSG), high-density plasma (HDP) oxide, or plasma-enhanced TEOS (PETEOS), in accordance with some embodiments.

The dielectric layer 120 includes multilayers made of multiple dielectric materials, such as a low dielectric constant or an extreme low dielectric constant (ELK) material, in accordance with some embodiments. The dielectric layer 120 is formed by spin-on coating, chemical vapor deposition (CVD), physical vapor deposition (PVD), atomic layer deposition (ALD), or another applicable process, in accordance with some embodiments.

As shown in FIG. 1A, a conductive structure 130 is formed over the dielectric layer 120, in accordance with some embodiments. The conductive structure 130 includes a wiring layer or wiring layers, such as a redistribution layer or redistribution layers, in accordance with some embodiments. For simplicity, FIG. 1A shows only one wiring layer, but is not limited thereto. In some other embodiments, the conductive structure 130 includes a conductive via structure or another suitable conductive structure.

The conductive structure 130 is electrically connected to devices (not shown) over or in the substrate 110, in accordance with some embodiments. The conductive structure 130 has a top surface 132, sidewalls 134, and a bottom surface 136, in accordance with some embodiments. The top surface 132 faces away from the substrate 110, in accordance with some embodiments. The sidewalls 134 surround the top surface 132 and the bottom surface 136, in accordance with some embodiments.

The conductive structure 130 includes copper (Cu) or another suitable conductive material, which is able to be oxidized into fiber-shaped metal oxide. The conductive structure 130 is formed using a plating process (or a deposition process), a photolithography process, and an etching process, in accordance with some embodiments. The plating process includes an electroplating process or an electroless plating process, in accordance with some embodiments. The deposition process includes a physical vapor deposition process or a chemical vapor deposition process, in accordance with some embodiments. In some embodiments, a surface cleaning process is performed over the conductive structure 130 to remove a native oxide layer (not shown) over the conductive structure 130.

Figure 1B:
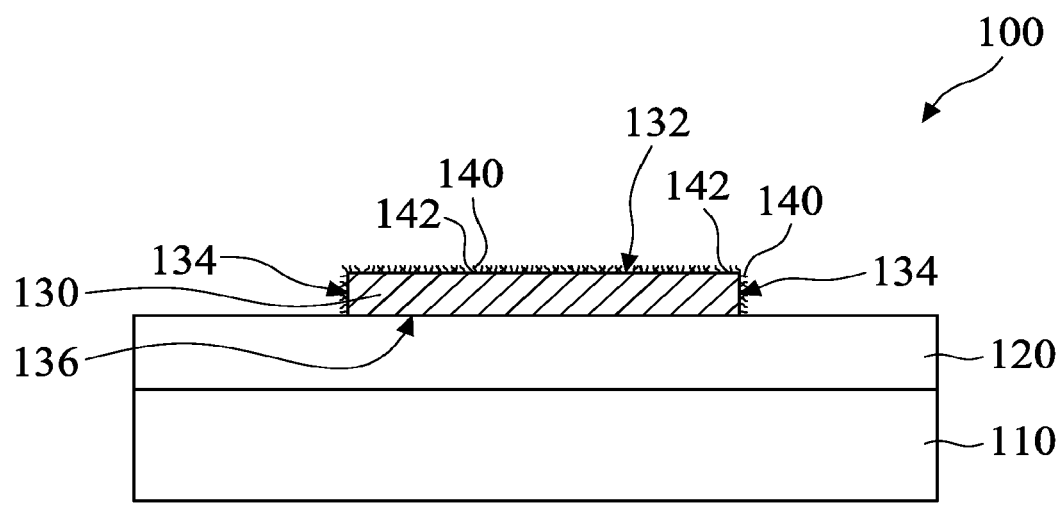

As shown in FIG. 1B, metal oxide fibers 140 are formed over the conductive structure 130, in accordance with some embodiments. The metal oxide fibers 140 are formed over the top surface 132 and the sidewalls 134 of the conductive structure 130, in accordance with some embodiments. Each of the metal oxide fibers 140 has an end portion 142 directly connected to the conductive structure 130, in accordance with some embodiments. The metal oxide fibers 140 are in direct contact with the conductive structure 130, in accordance with some embodiments.

In some embodiments, two adjacent metal oxide fibers 140 are in direct contact with each other. The metal oxide fibers 140 are formed randomly, in accordance with some embodiments. The conductive structure 130 includes a metal material (e.g., copper), and the metal oxide fibers 140 are made of an oxide of the metal material, in accordance with some embodiments. The oxide of the metal material includes copper oxide, in accordance with some embodiments.

The formation of the metal oxide fibers 140 includes oxidizing a superficial portion of the conductive structure 130, in accordance with some embodiments. The superficial portion of the conductive structure 130 is adjacent to the top surface 132 and the sidewalls 134, in accordance with some embodiments. The oxidization process of the superficial portion includes performing a thermal oxidation process or a chemical oxidation process on the superficial portion of the conductive structure 130 (or on the top surface 132 and the sidewalls 134), in accordance with some embodiments.

The chemical oxidation process uses an oxidation solution (e.g., $H_2O_2$), in accordance with some embodiments. The chemical oxidation process includes dipping the conductive structure 130 into the oxidation solution, in accordance with some embodiments. The thermal oxidation process is performed in an oxygen-containing environment, in accordance with some embodiments.

The thermal oxidation process is performed at a processing temperature ranging from about 100° C. to about 300° C., in accordance with some embodiments. If the processing temperature is lower than 100° C., the metal oxide fibers 140 may be substantially not formed. If the processing temperature is greater than 300° C., the devices formed in or over the substrate 110 may be adversely affected.

In some embodiments, the bottom surface 136 of the conductive structure 130 is not exposed to the oxidization process. Therefore, the metal oxide fibers 140 are not formed between the conductive structure 130 and the dielectric layer 120 thereunder, in accordance with some embodiments.

Figure 1C:
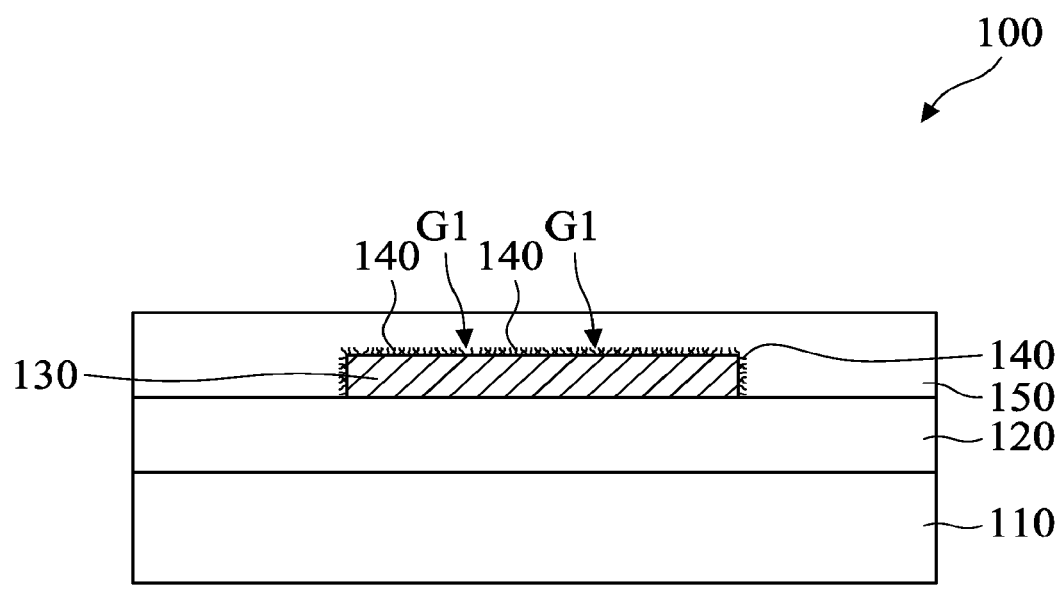

As shown in FIG. 1C, a dielectric layer 150 is formed over the dielectric layer 120, in accordance with some embodiments. The dielectric layer 150 covers the conductive structure 130 and the metal oxide fibers 140, in accordance with some embodiments. The dielectric layer 150 fills gaps G1 between the metal oxide fibers 140, in accordance with some embodiments.

The dielectric layer 150 surrounds each of the metal oxide fibers 140, in accordance with some embodiments. The metal oxide fibers 140 penetrate into the dielectric layer 150, in accordance with some embodiments. The metal oxide fibers 140 are embedded in the dielectric layer 150, in accordance with some embodiments. The metal oxide fibers 140 are in direct contact with the dielectric layer 150, in accordance with some embodiments.

Since the metal oxide fibers 140 are formed from the conductive structure 130, adhesion between the metal oxide fibers 140 and the conductive structure 130 is greater than adhesion between the dielectric layer 150 and the conductive structure 130. The boundary area between the metal oxide fibers 140 and the dielectric layer 150 is large, which improves adhesion between the metal oxide fibers 140 and the dielectric layer 150. Since the metal oxide fibers 140 connect between the conductive structure 130 and the dielectric layer 150, the metal oxide fibers 140 are able to prevent delamination between the conductive structure 130 and the dielectric layer 150. Therefore, the yield and the reliability of the semiconductor device structure 100 are improved.

The metal oxide fibers 140 have an average length greater than an average diameter of the metal oxide fibers 140, in accordance with some embodiments. The average length of the metal oxide fibers 140 ranges from about 20 nm to about 500 nm, in accordance with some embodiments. If the average length of the metal oxide fibers 140 is less than 20 nm, the boundary area between the metal oxide fibers 140 and the dielectric layer 150 may not be large enough to improve adhesion between the metal oxide fibers 140 and the dielectric layer 150. If the average length of the metal oxide fibers 140 is greater than 500 nm, the metal oxide fibers 140 may be easily broken.

The average diameter of the metal oxide fibers 140 ranges from about 1 nm to about 90 nm, in accordance with some embodiments. If the average diameter of the metal oxide fibers 140 is less than 1 nm, the metal oxide fibers 140 may be easily broken. If the average diameter of the metal oxide fibers 140 is greater than 90 nm, the boundary area between the metal oxide fibers 140 and the dielectric layer 150 may not be large enough to improve adhesion between the metal oxide fibers 140 and the dielectric layer 150. The metal oxide fibers 140 are also referred to as nano-metal oxide fibers, in accordance with some embodiments.

In some embodiments, a ratio of the average length to the average diameter of the metal oxide fibers 140 ranges from about 2 to about 80. As such, the metal oxide fibers 140 can have large enough boundary area between the metal oxide fibers 140 and the dielectric layer 150 and still have sufficient mechanical strength.

The dielectric layer 150 includes polymer (e.g., polyimide), oxide (e.g., $SiO_2$), borophosphosilicate glass (BPSG), spin on glass (SOG), undoped silicate glass (USG), fluorinated silicate glass (FSG), high-density plasma (HDP) oxide, or plasma-enhanced TEOS (PETEOS), in accordance with some embodiments. The metal oxide fibers 140 and the dielectric layer 150 are made of different materials, in accordance with some embodiments.

The dielectric layer 150 includes multilayers made of multiple dielectric materials, such as a low dielectric constant or an extreme low dielectric constant (ELK) material, in accordance with some embodiments. The dielectric layer 150 is formed by spin-on coating, chemical vapor deposition (CVD), physical vapor deposition (PVD), atomic layer deposition (ALD), or another applicable process, in accordance with some embodiments.

Figure 1D:
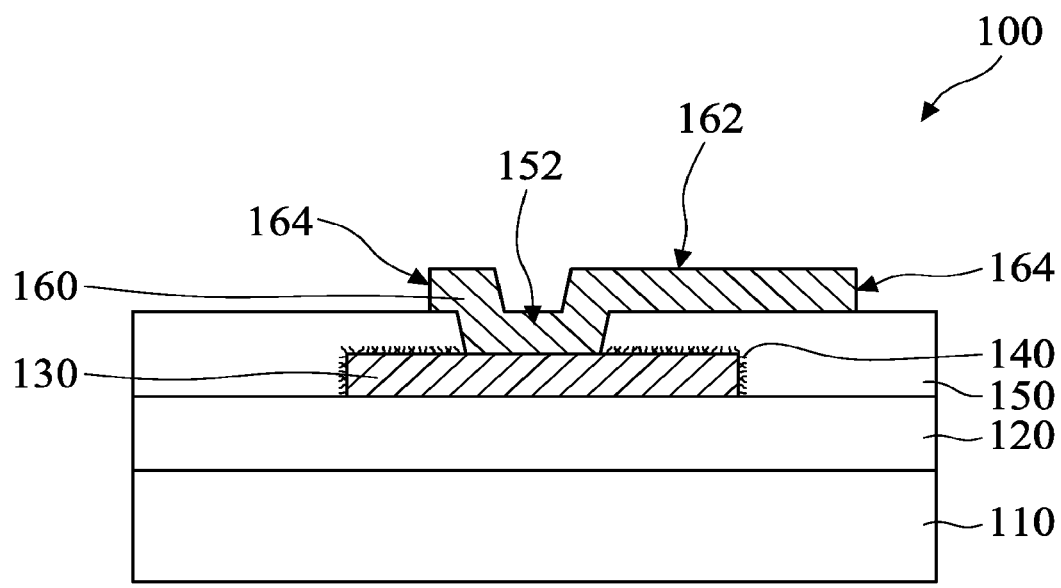

As shown in FIG. 1D, a portion of the dielectric layer 150 and the metal oxide fibers 140 under the portion of the dielectric layer 150 are removed, in accordance with some embodiments. The removal process includes a photolithography process and an etching process, in accordance with some embodiments.

After the removal process, a through hole 152 is formed, in accordance with some embodiments. The through hole 152 exposes a portion of the conductive structure 130, in accordance with some embodiments. There is substantially no metal oxide fiber in the through hole 152, in accordance with some embodiments.

Figure 1E:
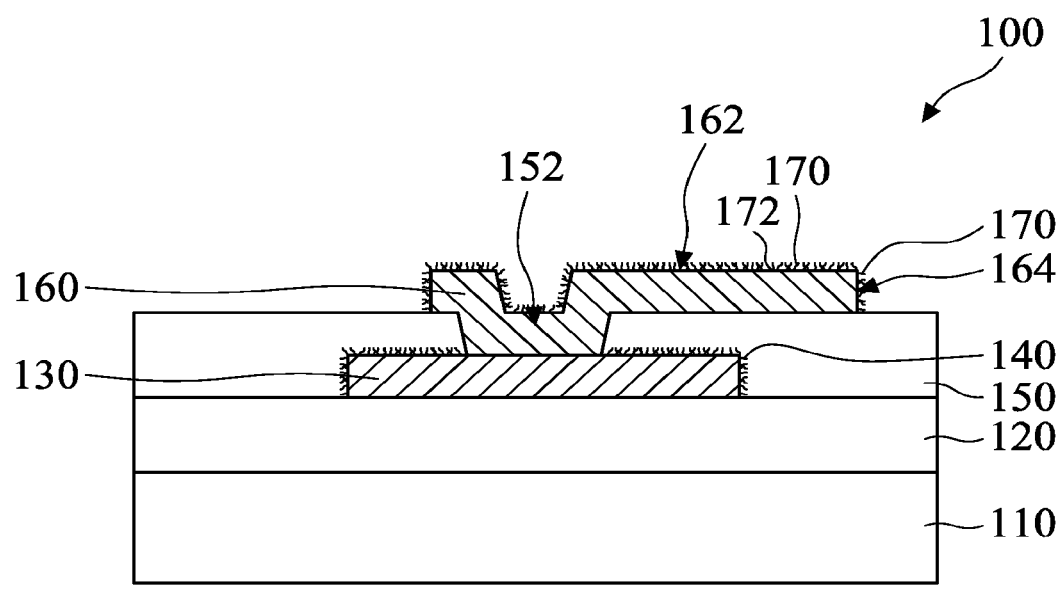

As shown in FIG. 1E, a conductive layer 160 is formed over the dielectric layer 150 and extends into the through hole 152, in accordance with some embodiments. The conductive layer 160 is electrically connected to the conductive structure 130, in accordance with some embodiments. The conductive layer 160 includes a redistribution layer and a conductive via structure, in accordance with some embodiments.

The conductive layer 160 has a top surface 162 and sidewalls 164, in accordance with some embodiments. The sidewalls 164 surround the top surface 162, in accordance with some embodiments. The conductive layer 160 includes copper or another suitable conductive material. The conductive layer 160 is formed using a plating process (or a deposition process), a photolithography process, and an etching process, in accordance with some embodiments.

As shown in FIG. 1E, metal oxide fibers 170 are formed over the conductive layer 160, in accordance with some embodiments. The metal oxide fibers 170 are also referred to as nano-metal oxide fibers, in accordance with some embodiments. The metal oxide fibers 170 are formed over the top surface 162 and the sidewalls 164 of the conductive layer 160, in accordance with some embodiments.

The metal oxide fibers 170 are not formed between the conductive layer 160 and the dielectric layer 150 thereunder, in accordance with some embodiments. Each of the metal oxide fibers 170 has an end portion 172 directly connected to the conductive layer 160, in accordance with some embodiments. The metal oxide fibers 170 are in direct contact with the conductive layer 160, in accordance with some embodiments. In some embodiments, two adjacent metal oxide fibers 170 are in direct contact with each other.

The average length of the metal oxide fibers 170 ranges from about 20 nm to about 500 nm, in accordance with some embodiments. The average diameter of the metal oxide fibers 170 ranges from about 1 nm to about 90 nm, in accordance with some embodiments. The conductive layer 160 includes a metal material (e.g., copper), and the metal oxide fibers 170 are made of an oxide of the metal material, in accordance with some embodiments. The oxide of the metal material includes copper oxide, in accordance with some embodiments. The metal oxide fibers 140 and 170 are dielectric fibers, in accordance with some embodiments.

The formation of the metal oxide fibers 170 includes oxidizing a superficial portion of the conductive layer 160, in accordance with some embodiments. The superficial portion of the conductive layer 160 is adjacent to the top surface 162 and the sidewalls 164, in accordance with some embodiments. The oxidization process of the superficial portion includes performing a thermal oxidation process or a chemical oxidation process on the superficial portion of the conductive layer 160, in accordance with some embodiments.

The chemical oxidation process uses an oxidation solution (e.g., $H_2O_2$), in accordance with some embodiments. The chemical oxidation process includes dipping the conductive layer 160 into the oxidation solution, in accordance with some embodiments. The thermal oxidation process is performed in an oxygen-containing environment, in accordance with some embodiments. The thermal oxidation process is performed at a processing temperature ranging from about 100° C. to about 300° C., in accordance with some embodiments.

Figure 1F:
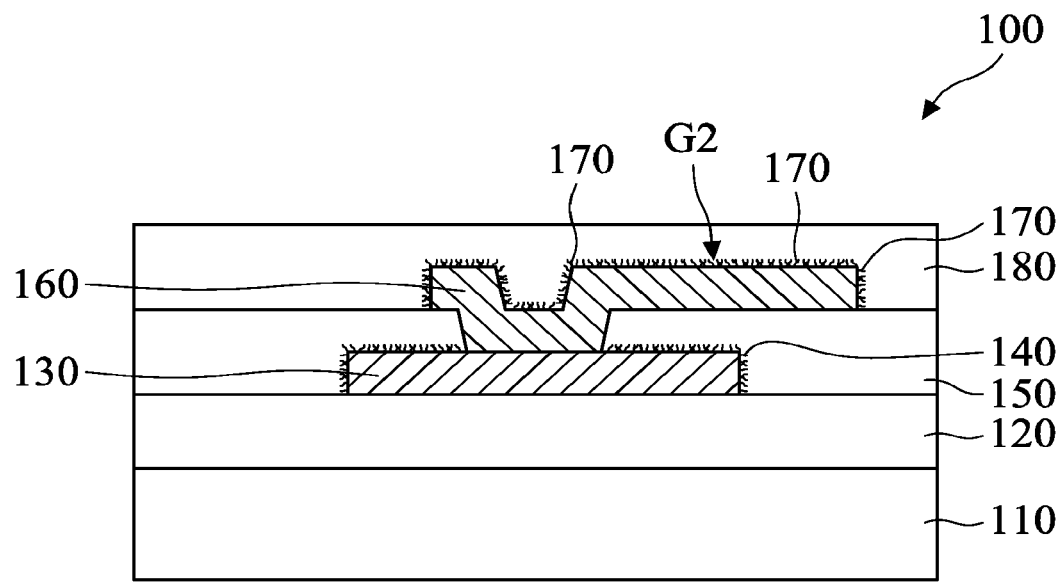

As shown in FIG. 1F, a dielectric layer 180 is formed over the dielectric layer 150, in accordance with some embodiments. The dielectric layer 180 covers the conductive layer 160 and the metal oxide fibers 170, in accordance with some embodiments. The dielectric layer 180 fills gaps G2 between the metal oxide fibers 170, in accordance with some embodiments.

The dielectric layer 180 surrounds each of the metal oxide fibers 170, in accordance with some embodiments. The metal oxide fibers 170 penetrate into the dielectric layer 180, in accordance with some embodiments. The metal oxide fibers 170 are embedded in the dielectric layer 180, in accordance with some embodiments. The metal oxide fibers 170 are in direct contact with the dielectric layer 180, in accordance with some embodiments.

The dielectric layer 180 includes polymer (e.g., polyimide), oxide (e.g., $SiO_2$), borophosphosilicate glass (BPSG), spin on glass (SOG), undoped silicate glass (USG), fluorinated silicate glass (FSG), high-density plasma (HDP) oxide, or plasma-enhanced TEOS (PETEOS), in accordance with some embodiments.

The dielectric layer 180 includes multilayers made of multiple dielectric materials, such as a low dielectric constant or an extreme low dielectric constant (ELK) material, in accordance with some embodiments. The dielectric layer 180 is formed by spin-on coating, chemical vapor deposition (CVD), physical vapor deposition (PVD), atomic layer deposition (ALD), or another applicable process, in accordance with some embodiments.

Figure 1G:
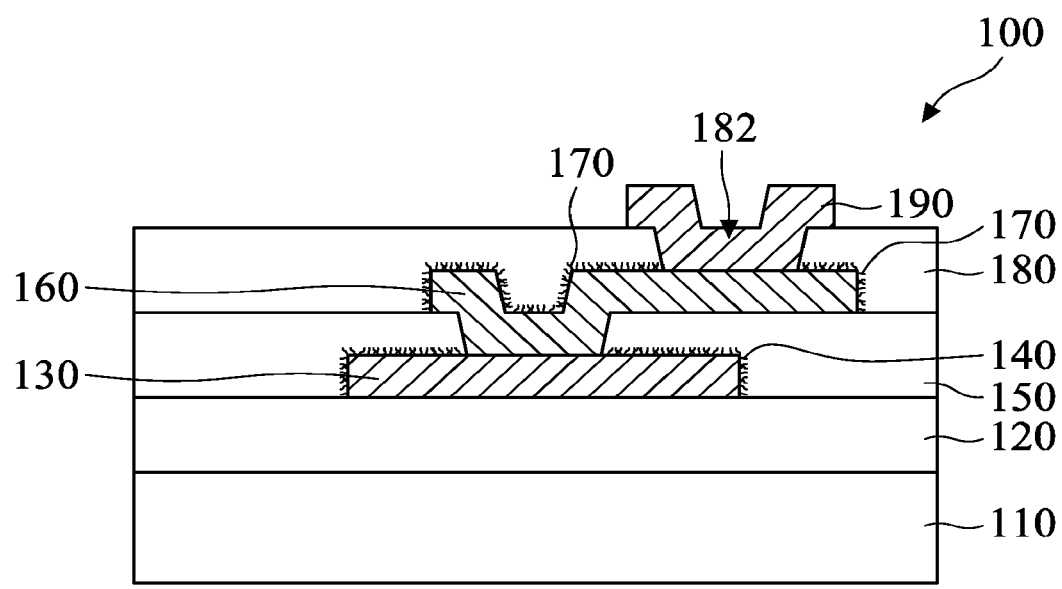

As shown in FIG. 1G, a portion of the dielectric layer 180 and the metal oxide fibers 170 under the portion of the dielectric layer 180 are removed, in accordance with some embodiments. The removal process includes a photolithography process and an etching process, in accordance with some embodiments. After the removal process, a through hole 182 is formed in the dielectric layer 180 and exposes a portion of the conductive layer 160, in accordance with some embodiments.

As shown in FIG. 1G, a bonding pad 190 is formed over the dielectric layer 180 and extends into the through hole

182, in accordance with some embodiments. The bonding pad 190 is electrically connected to the conductive layer 160 and the conductive structure 130, in accordance with some embodiments. The bonding pad 190 includes copper, aluminum, tungsten, nickel, palladium, gold, or another suitable conductive material. The bonding pad 190 is formed using a plating process (or a deposition process), a photolithography process, and an etching process, in accordance with some embodiments.

Figure 1H:
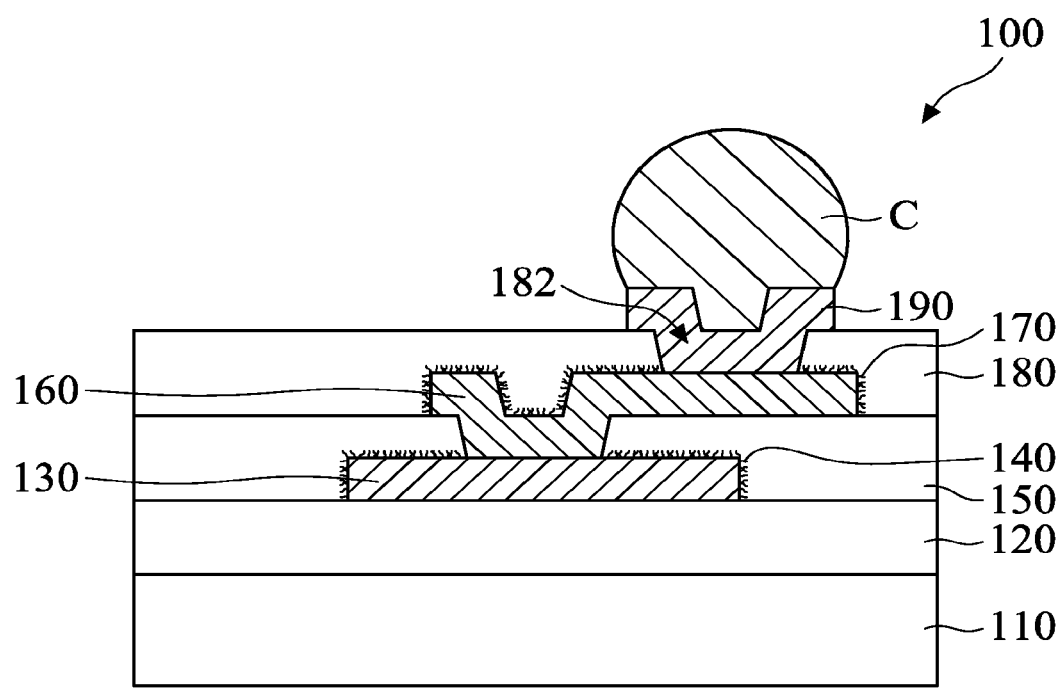

As shown in FIG. 1H, a conductive bump C is formed over the bonding pad 190, in accordance with some embodiments. The conductive bump C includes tin (Sn) or another suitable material, in accordance with some embodiments. The formation of the conductive bump C includes forming a solder paste over the bonding pad 190 and reflowing the solder paste, in accordance with some embodiments. The reflow temperature ranges from about 100° C. to about 300° C., in accordance with some embodiments.

The metal oxide fibers 140 are able to prevent delamination between the conductive structure 130 and the dielectric layer 150 resulting from the coefficient of thermal expansion (CTE) mismatch between the conductive structure 130 and the dielectric layer 150 during the reflow process, in accordance with some embodiments. The metal oxide fibers 170 are able to prevent delamination between the conductive structure 160 and the dielectric layer 180 resulting from the coefficient of thermal expansion mismatch between the conductive structure 160 and the dielectric layer 180 during the reflow process, in accordance with some embodiments.

FIGS. 2A-2F are cross-sectional views of various stages of a process for forming a semiconductor device structure 200, in accordance with some embodiments. It should be noted that the semiconductor device structure 200 is similar to the semiconductor device structure 100 of FIGS. 1A-1H, except that the semiconductor device structure 200 further has a metal oxide layer 210 over the conductive structure 130, in accordance with some embodiments.

In the present embodiment and the embodiment mentioned above, same reference numbers are used to designate same or similar elements. Therefore, the materials and the manufacturing methods of the elements with the same reference numbers are provided by referring to the relative description of the embodiment of FIGS. 1A-1I.

Figure 2A:
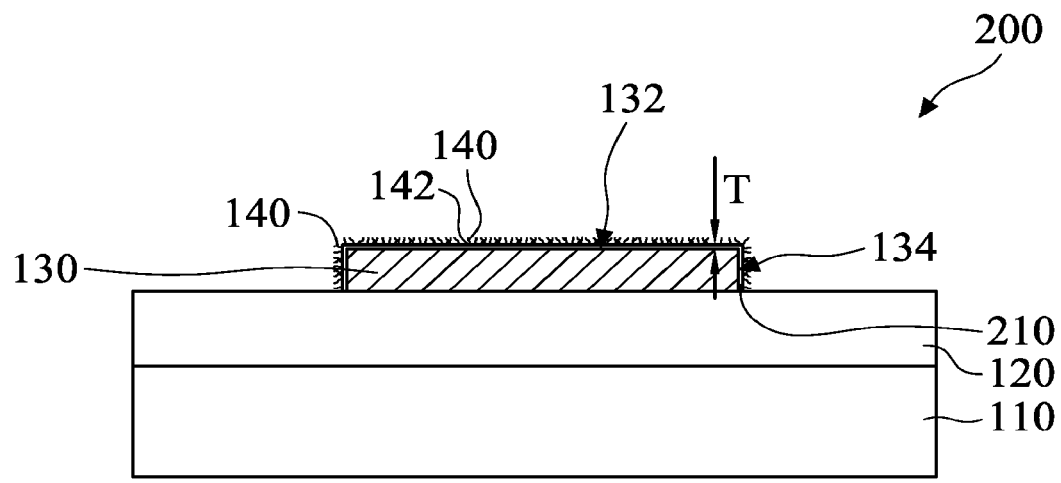
FIGS. 2A-2F are cross-sectional views of various stages of a process for forming a semiconductor device structure, in accordance with some embodiments.

As shown in FIG. 2A, a substrate 110 is provided, in accordance with some embodiments. As shown in FIG. 2A, a dielectric layer 120 is formed over the substrate 110, in accordance with some embodiments. As shown in FIG. 2A, a conductive structure 130 is formed over the dielectric layer 120, in accordance with some embodiments. The conductive structure 130 includes a wiring layer or wiring layers, such as a redistribution layer or redistribution layers, in accordance with some embodiments. For simplicity, FIG. 2A shows only one wiring layer, but is not limited thereto. In some other embodiments, the conductive structure 130 includes a conductive via structure or another suitable conductive structure.

The conductive structure 130 is electrically connected to devices (not shown) over or in the substrate 110, in accordance with some embodiments. The conductive structure 130 has a top surface 132 and sidewalls 134, in accordance with some embodiments. The top surface 132 faces away from the substrate 110, in accordance with some embodiments. The sidewalls 134 surround the top surface 132, in accordance with some embodiments. The conductive structure 130 includes copper or another suitable conductive material.

As shown in FIG. 2A, a metal oxide layer 210 and metal oxide fibers 140 are formed over the conductive structure 130, in accordance with some embodiments. The metal oxide layer 210 conformally covers the top surface 132 and the sidewalls 134 of the conductive structure 130, in accordance with some embodiments. The metal oxide layer 210 continuously covers the top surface 132 and the sidewalls 134 of the conductive structure 130, in accordance with some embodiments.

The metal oxide fibers 140 are formed over the metal oxide layer 210, in accordance with some embodiments. The metal oxide fibers 140 together form a metal oxide fiber layer, in accordance with some embodiments. The metal oxide fiber layer has a density less than a density of the metal oxide layer 210, in accordance with some embodiments. Each of the metal oxide fibers 140 has an end portion 142 connected to the metal oxide layer 210, in accordance with some embodiments.

The metal oxide fibers 140 are in direct contact with the metal oxide layer 210, in accordance with some embodiments. The metal oxide fibers 140 and the metal oxide layer 210 are not formed between the conductive structure 130 and the dielectric layer 120 thereunder, in accordance with some embodiments. In some embodiments, a thickness T of the metal oxide layer 210 ranges from about 2 nm to about 50 nm. In some embodiments, the average length of the metal oxide fibers 140 is greater than the thickness T of the metal oxide layer 210.

In some embodiments, two adjacent metal oxide fibers 140 are in direct contact with each other. The metal oxide fibers 140 and the metal oxide layer 210 are made of the same material, in accordance with some embodiments. The conductive structure 130 includes a metal material (e.g., copper), and the metal oxide fibers 140 and the metal oxide layer 210 are made of an oxide of the metal material, in accordance with some embodiments. The oxide of the metal material includes copper oxide, in accordance with some embodiments.

The formation of the metal oxide fibers 140 and the metal oxide layer 210 includes oxidizing a superficial portion of the conductive structure 130, in accordance with some embodiments. The superficial portion of the conductive structure 130 is adjacent to the top surface 132 and the sidewalls 134, in accordance with some embodiments. The oxidization process of the superficial portion includes performing a thermal oxidation process or a chemical oxidation process on the superficial portion of the conductive structure 130 (or on the top surface 132 and the sidewalls 134), in accordance with some embodiments.

The chemical oxidation process uses an oxidation solution (e.g., $H_2O_2$), in accordance with some embodiments. The chemical oxidation process includes dipping the conductive structure 130 into the oxidation solution, in accordance with some embodiments. The thermal oxidation process is performed in an oxygen-containing environment, in accordance with some embodiments.

The thermal oxidation process is performed at a processing temperature ranging from about 100° C. to about 300° C., in accordance with some embodiments. If the processing temperature is lower than 100° C., the metal oxide fibers 140 may be substantially not formed. If the processing temperature is greater than 300° C., the devices formed in or over the substrate 110 may be adversely affected.

In some embodiments, the metal oxide layer 210 includes native oxide and non-native oxide, which is formed by the aforementioned thermal oxidation process or the aforementioned chemical oxidation process. In some embodiments, the metal oxide layer 210 includes a native oxide layer.

Figure 2B:
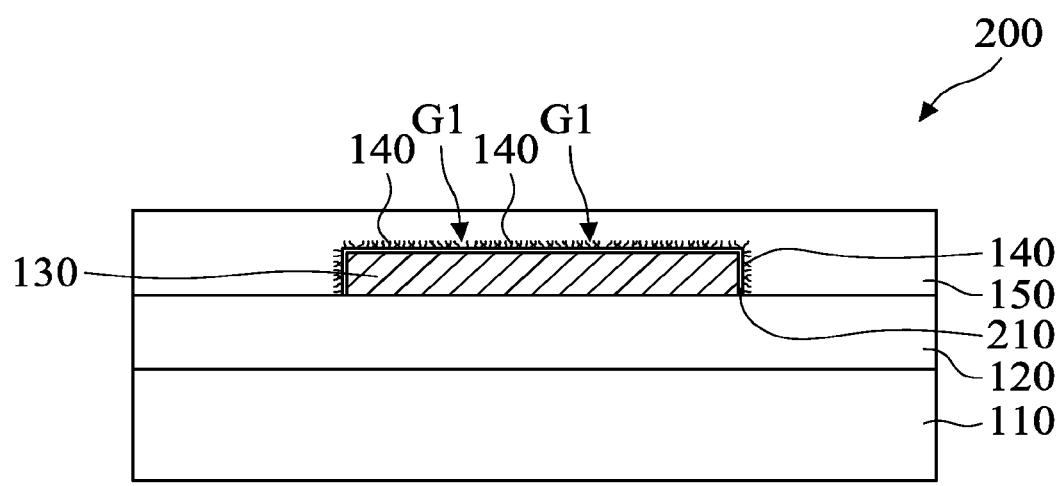

As shown in FIG. 2B, a dielectric layer 150 is formed over the dielectric layer 120, in accordance with some embodiments. The dielectric layer 150 covers the conductive structure 130, the metal oxide fibers 140, and the metal oxide layer 210, in accordance with some embodiments. The dielectric layer 150 fills gaps G1 between the metal oxide fibers 140, in accordance with some embodiments.

The dielectric layer 150 surrounds each of the metal oxide fibers 140, in accordance with some embodiments. The metal oxide fibers 140 penetrate into the dielectric layer 150, in accordance with some embodiments. The metal oxide fibers 140 are embedded in the dielectric layer 150, in accordance with some embodiments. The metal oxide fibers 140 are in direct contact with the dielectric layer 150, in accordance with some embodiments.

Since the metal oxide layer 210 is formed from the conductive structure 130, adhesion between the metal oxide layer 210 and the conductive structure 130 is greater than adhesion between the dielectric layer 150 and the conductive structure 130. The boundary area between the metal oxide fibers 140 and the dielectric layer 150 is large, which improves adhesion between the metal oxide fibers 140 and the dielectric layer 150.

Since the metal oxide fibers 140 and the metal oxide layer 210 connect between the conductive structure 130 and the dielectric layer 150, delamination between the conductive structure 130 and the dielectric layer 150 is prevented. Therefore, the yield and the reliability of the semiconductor device structure 200 are improved.

The metal oxide fibers 140 have an average length greater than an average diameter of the metal oxide fibers 140, in accordance with some embodiments. The average length of the metal oxide fibers 140 ranges from about 20 nm to about 500 nm, in accordance with some embodiments. The average diameter of the metal oxide fibers 140 ranges from about 1 nm to about 90 nm, in accordance with some embodiments. The metal oxide fibers 140 are also referred to as nano-metal oxide fibers, in accordance with some embodiments.

Figure 2C:
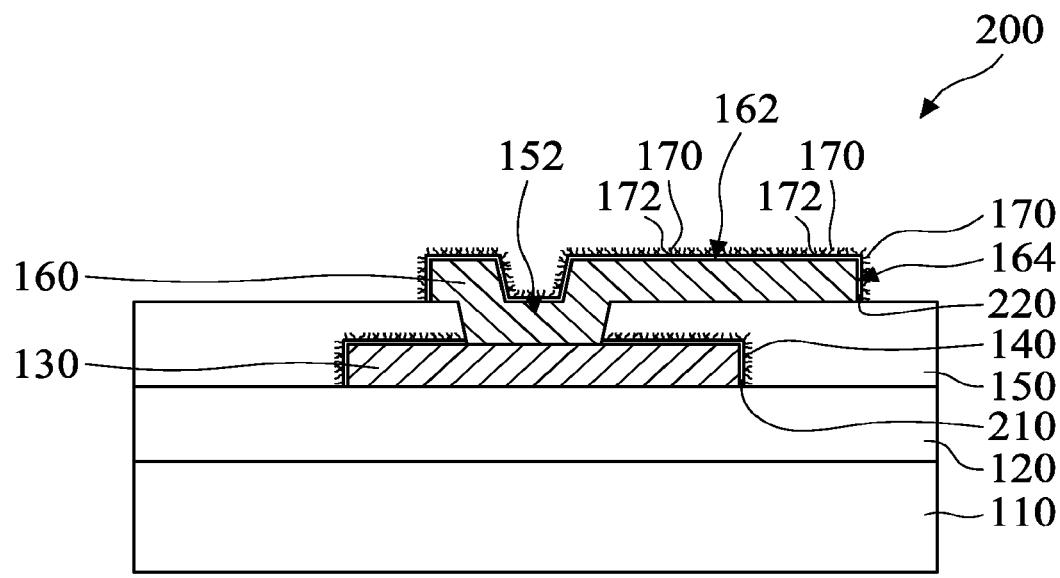

As shown in FIG. 2C, a portion of the dielectric layer 150, the metal oxide fibers 140 thereunder, and the metal oxide layer 210 under the portion of the dielectric layer 150 are removed, in accordance with some embodiments. The removal process includes a photolithography process and an etching process, in accordance with some embodiments.

After the removal process, a through hole 152 is formed, in accordance with some embodiments. The through hole 152 exposes a portion of the conductive structure 130, in accordance with some embodiments. There is substantially no metal oxide fiber in the through hole 152, in accordance with some embodiments.

As shown in FIG. 2C, a conductive layer 160 is formed over the dielectric layer 150 and extends into the through hole 152, in accordance with some embodiments. The conductive layer 160 is electrically connected to the conductive structure 130, in accordance with some embodiments. The conductive layer 160 includes a wiring layer and a conductive via structure, in accordance with some embodiments.

The conductive layer 160 has a top surface 162 and sidewalls 164, in accordance with some embodiments. The sidewalls 164 surround the top surface 162, in accordance with some embodiments. The conductive layer 160 includes copper or another suitable conductive material. The conductive layer 160 is formed using a plating process (or a deposition process), a photolithography process, and an etching process, in accordance with some embodiments.

As shown in FIG. 2C, a metal oxide layer 220 and metal oxide fibers 170 are formed over the conductive layer 160, in accordance with some embodiments. The metal oxide fibers 170 are also referred to as nano-metal oxide fibers, in accordance with some embodiments. The metal oxide fibers 170 and the metal oxide layer 220 are formed over the top surface 162 and the sidewalls 164 of the conductive layer 160, in accordance with some embodiments.

The metal oxide fibers 170 and the metal oxide layer 220 are not formed between the conductive layer 160 and the dielectric layer 150 thereunder, in accordance with some embodiments. Each of the metal oxide fibers 170 has an end portion 172 directly connected to the metal oxide layer 220, in accordance with some embodiments. The metal oxide fibers 170 are in direct contact with the metal oxide layer 220, in accordance with some embodiments. In some embodiments, two adjacent metal oxide fibers 170 are in direct contact with each other.

The average length of the metal oxide fibers 170 ranges from about 20 nm to about 500 nm, in accordance with some embodiments. The average diameter of the metal oxide fibers 170 ranges from about 1 nm to about 90 nm, in accordance with some embodiments. The conductive layer 160 includes a metal material (e.g., copper), and the metal oxide fibers 170 and the metal oxide layer 220 are made of an oxide of the metal material, in accordance with some embodiments. The oxide of the metal material includes copper oxide, in accordance with some embodiments.

The formation of the metal oxide fibers 170 and the metal oxide layer 220 includes oxidizing a superficial portion of the conductive layer 160, in accordance with some embodiments. The superficial portion of the conductive layer 160 is adjacent to the top surface 162 and the sidewalls 164, in accordance with some embodiments. The oxidization process of the superficial portion includes performing a thermal oxidation process or a chemical oxidation process on the superficial portion of the conductive layer 160, in accordance with some embodiments.

The chemical oxidation process uses an oxidation solution (e.g., $H_2O_2$), in accordance with some embodiments. The chemical oxidation process includes dipping the conductive layer 160 into the oxidation solution, in accordance with some embodiments. The thermal oxidation process is performed in an oxygen-containing environment, in accordance with some embodiments. The thermal oxidation process is performed at a processing temperature ranging from about 100° C. to about 300° C., in accordance with some embodiments.

Figure 2D:
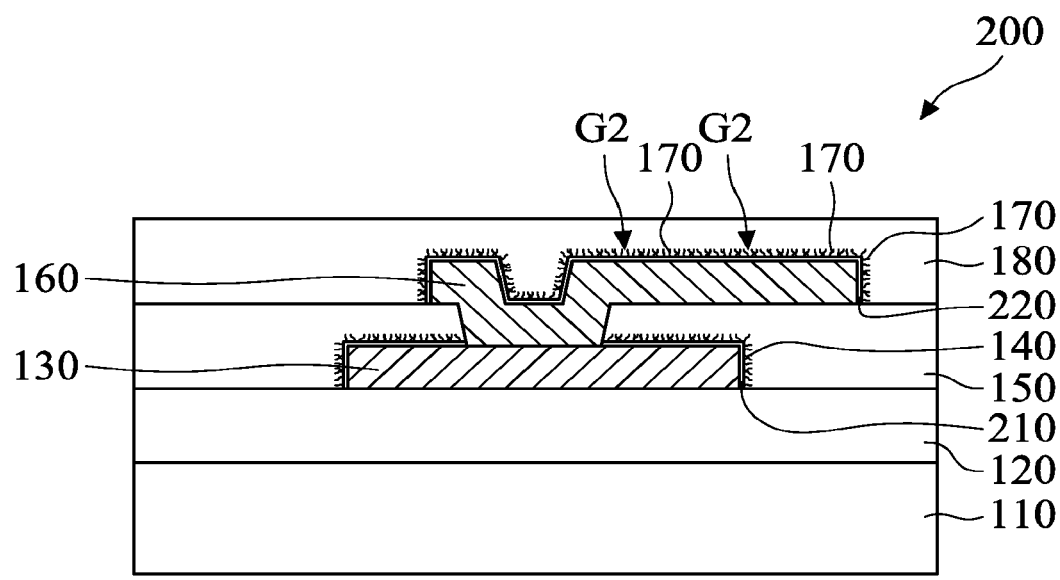

As shown in FIG. 2D, a dielectric layer 180 is formed over the dielectric layer 150, in accordance with some embodiments. The dielectric layer 180 covers the conductive layer 160, the metal oxide fibers 170, and the metal oxide layer 220, in accordance with some embodiments. The dielectric layer 180 fills gaps G2 between the metal oxide fibers 170, in accordance with some embodiments.

The dielectric layer 180 surrounds each of the metal oxide fibers 170, in accordance with some embodiments. The metal oxide fibers 170 penetrate into the dielectric layer 180, in accordance with some embodiments. The metal oxide fibers 170 are embedded in the dielectric layer 180, in accordance with some embodiments. The metal oxide fibers 170 are in direct contact with the dielectric layer 180, in accordance with some embodiments.

Figure 2E:
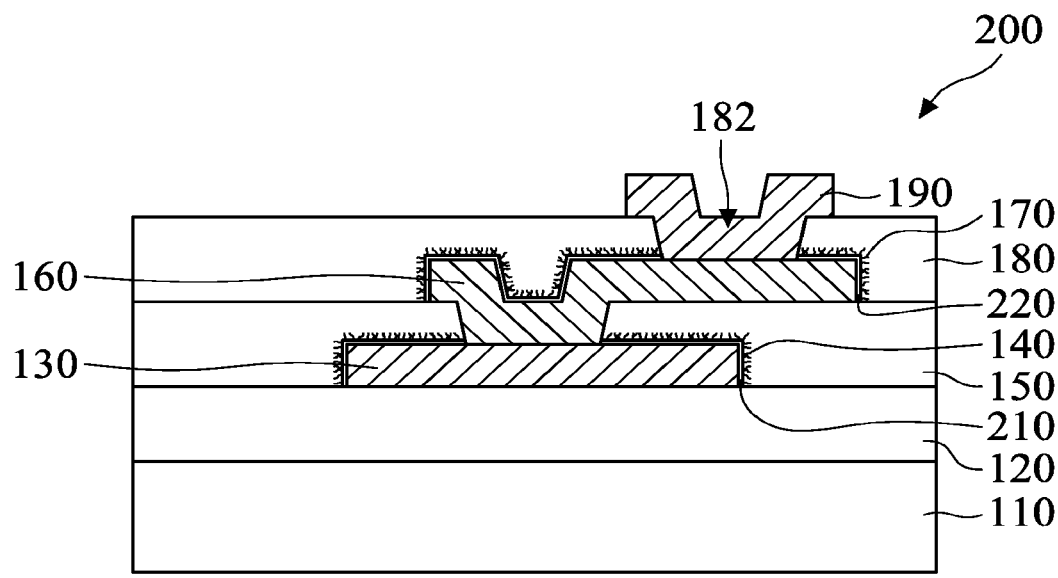

As shown in FIG. 2E, a portion of the dielectric layer 180, the metal oxide fibers 170 thereunder, and the metal oxide layer 220 under the portion of the dielectric layer 180 are removed, in accordance with some embodiments. After the removal process, a through hole 182 is formed in the dielectric layer 180 and exposes a portion of the conductive layer 160, in accordance with some embodiments.

As shown in FIG. 2E, a bonding pad 190 is formed over the dielectric layer 180 and extends into the through hole 182, in accordance with some embodiments. The bonding pad 190 is electrically connected to the conductive layer 160 and the conductive structure 130, in accordance with some embodiments.

Figure 2F:
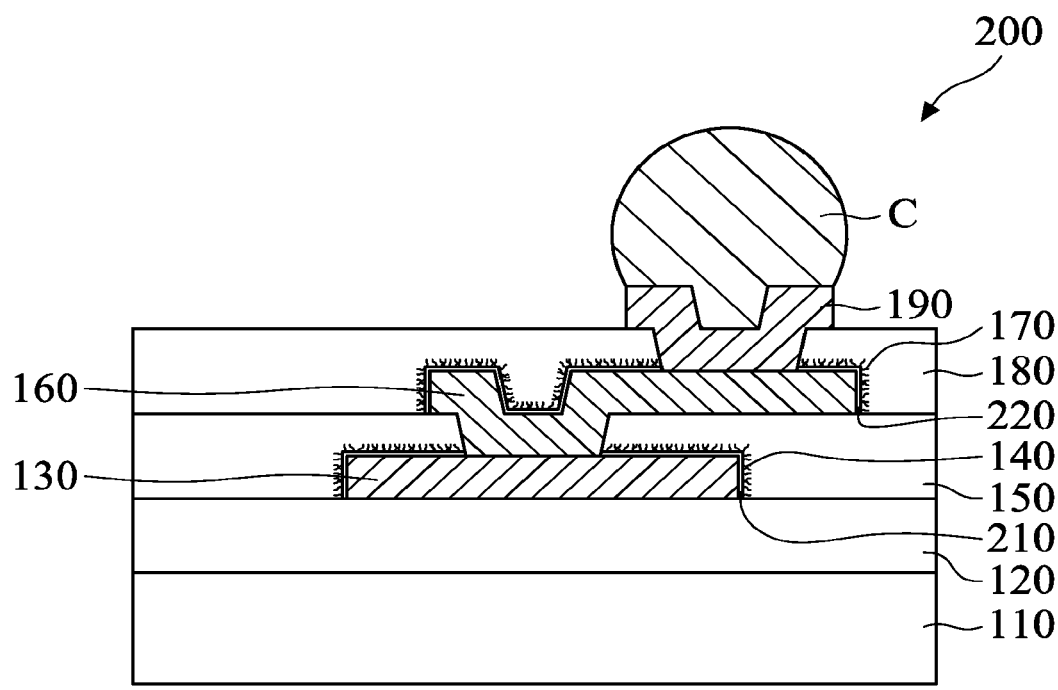

As shown in FIG. 2F, a conductive bump C is formed over the bonding pad 190, in accordance with some embodiments. The conductive bump C includes tin (Sn) or another suitable material, in accordance with some embodiments. The formation of the conductive bump C includes forming a solder paste over the bonding pad 190 and reflowing the solder paste, in accordance with some embodiments. The reflow temperature ranges from about 100° C. to about 300° C., in accordance with some embodiments.

The metal oxide fibers 140 and the metal oxide layer 210 are able to prevent delamination between the conductive structure 130 and the dielectric layer 150 resulting from the coefficient of thermal expansion (CTE) mismatch between the conductive structure 130 and the dielectric layer 150 during the reflow process, in accordance with some embodiments.

The metal oxide fibers 170 and the metal oxide layer 220 are able to prevent delamination between the conductive structure 160 and the dielectric layer 180 resulting from the coefficient of thermal expansion mismatch between the conductive structure 160 and the dielectric layer 180 during the reflow process, in accordance with some embodiments.

Figure 3A:
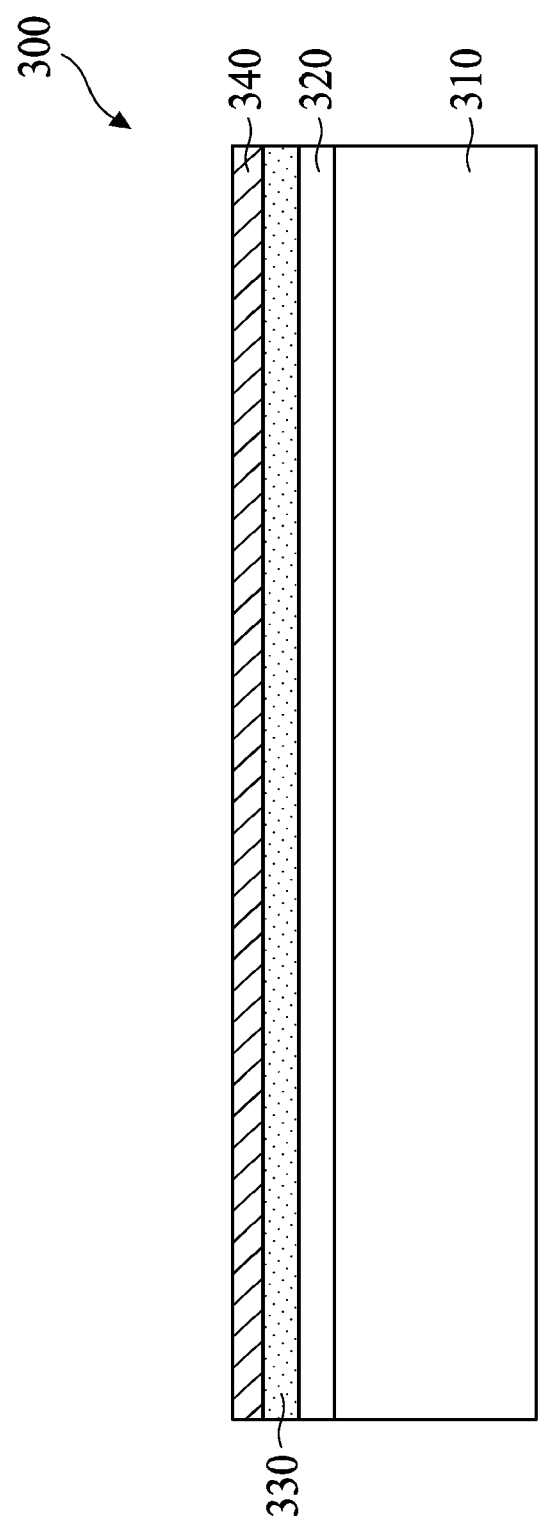
FIGS. 3A-3O are cross-sectional views of various stages of a process for forming a semiconductor device structure, in accordance with some embodiments.
Figure 3B:
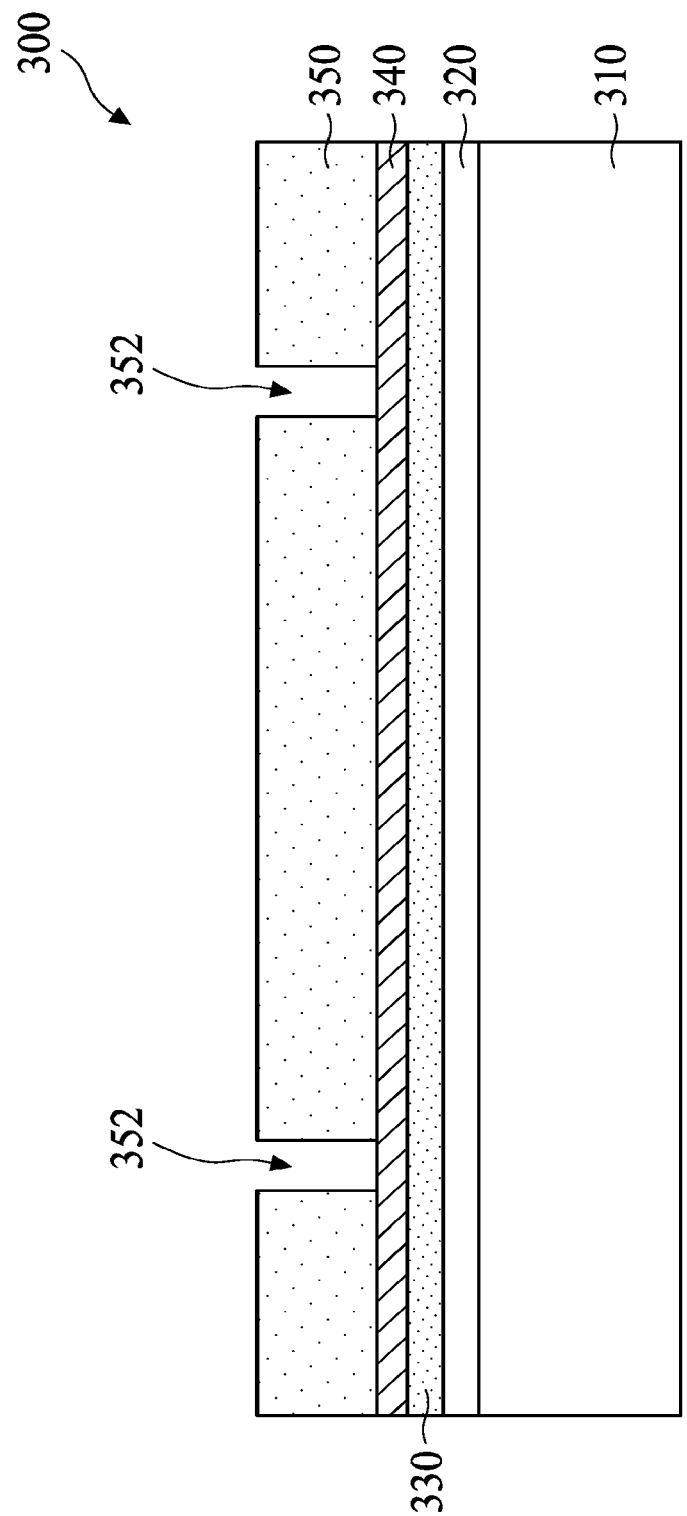
Figure 3C:
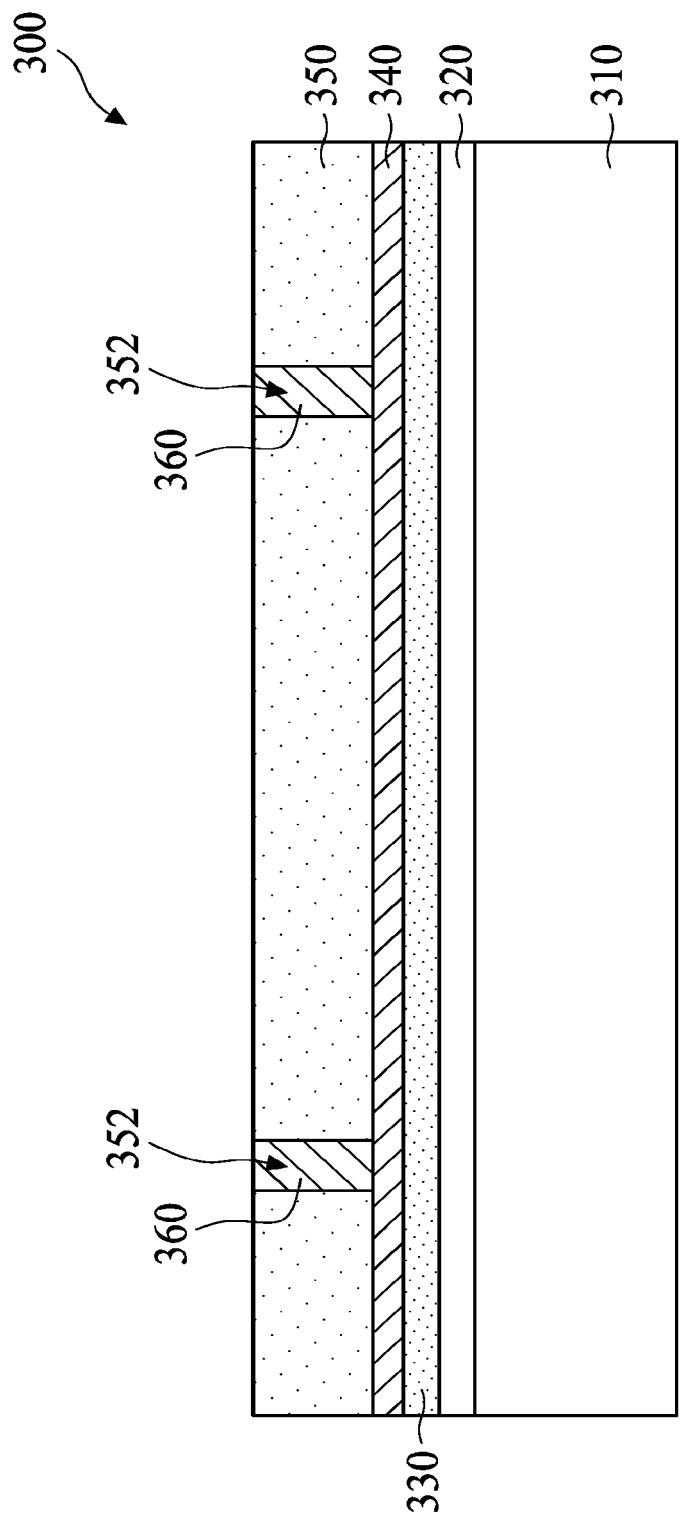
Figure 3D:
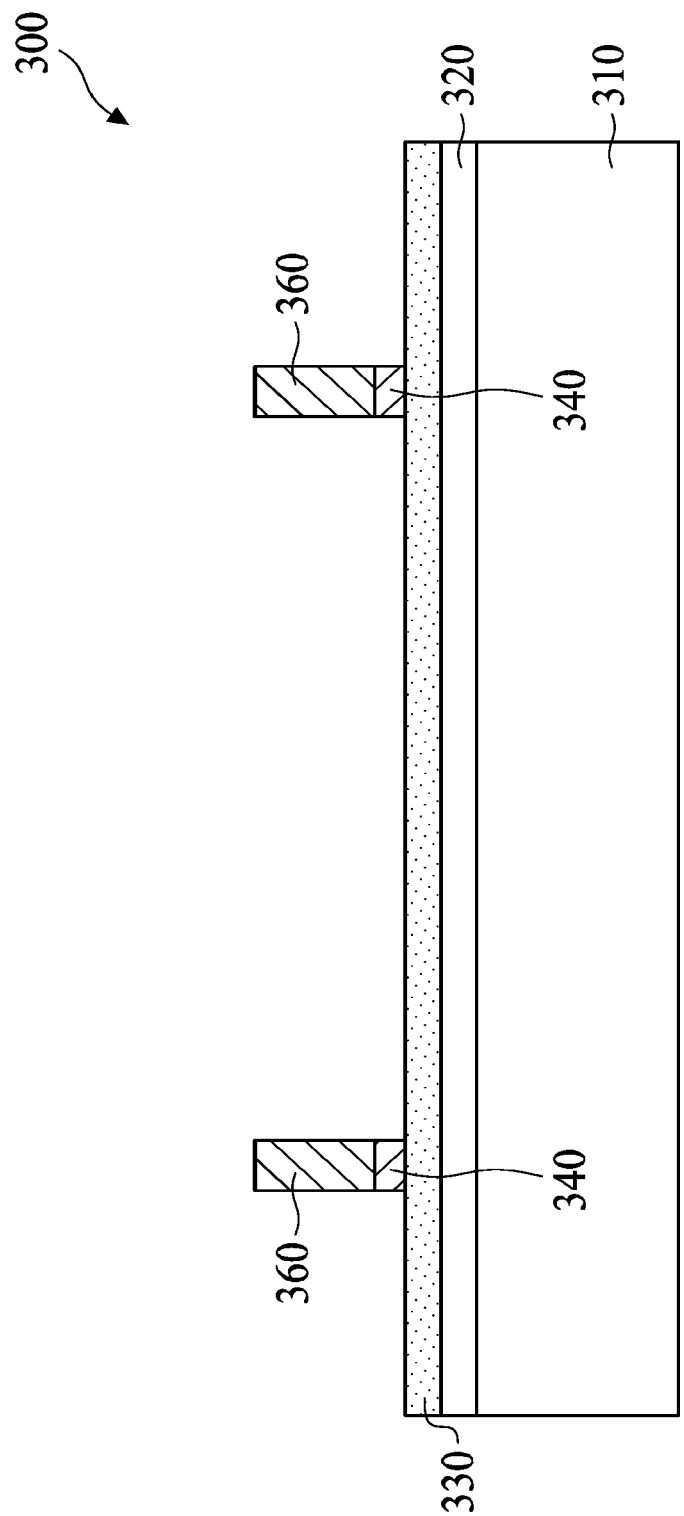
Figure 3E:
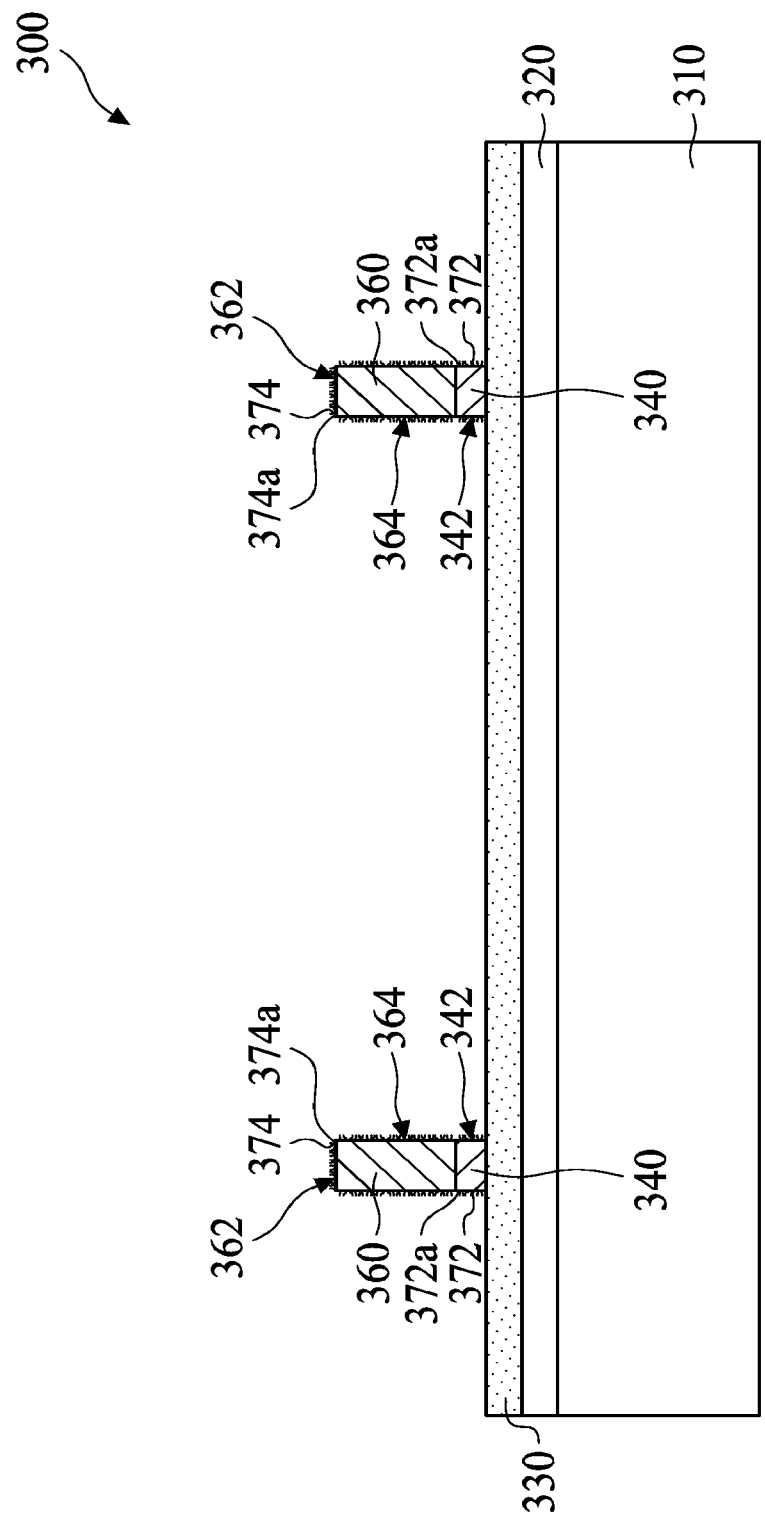
Figure 3F:
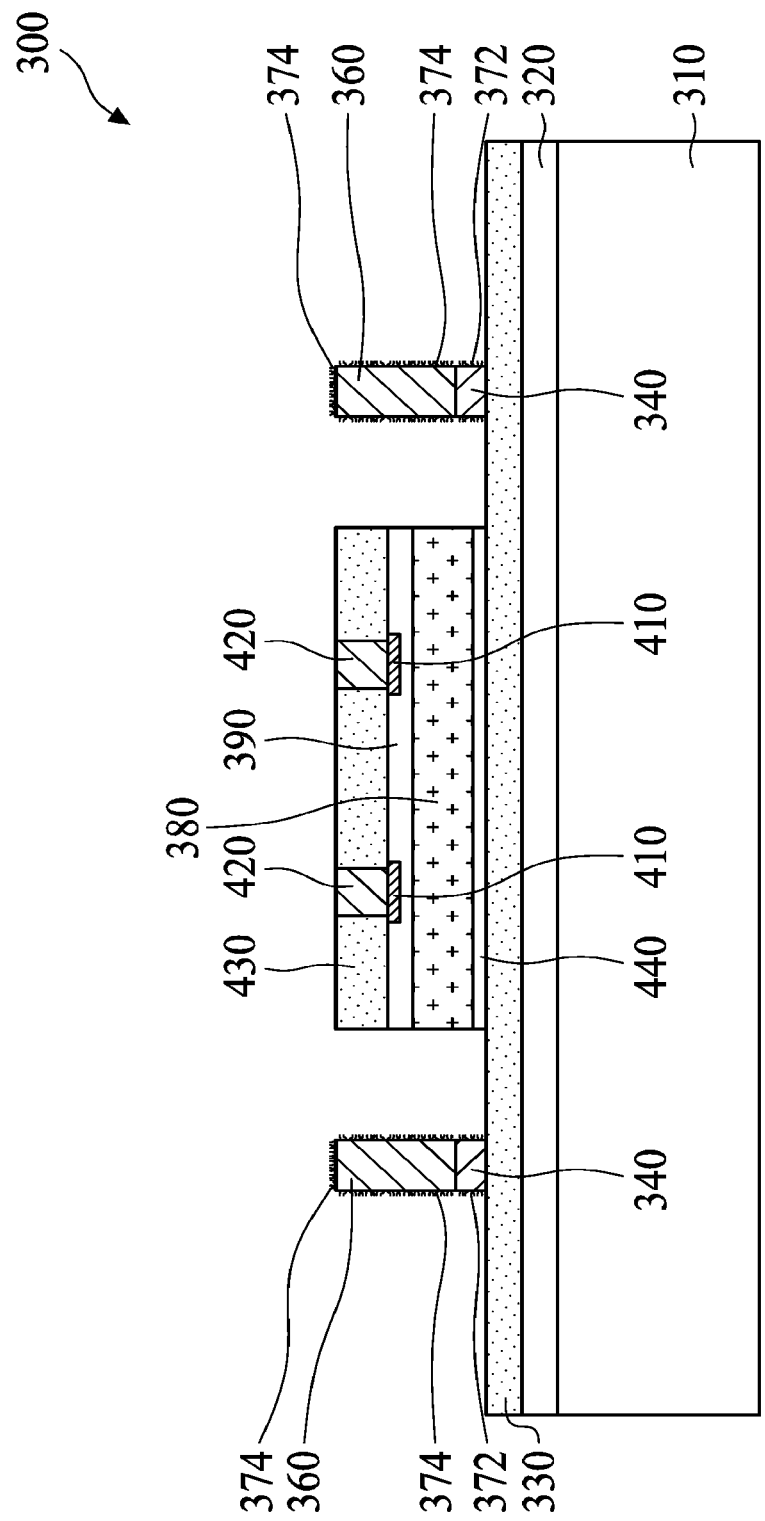
Figure 3G:
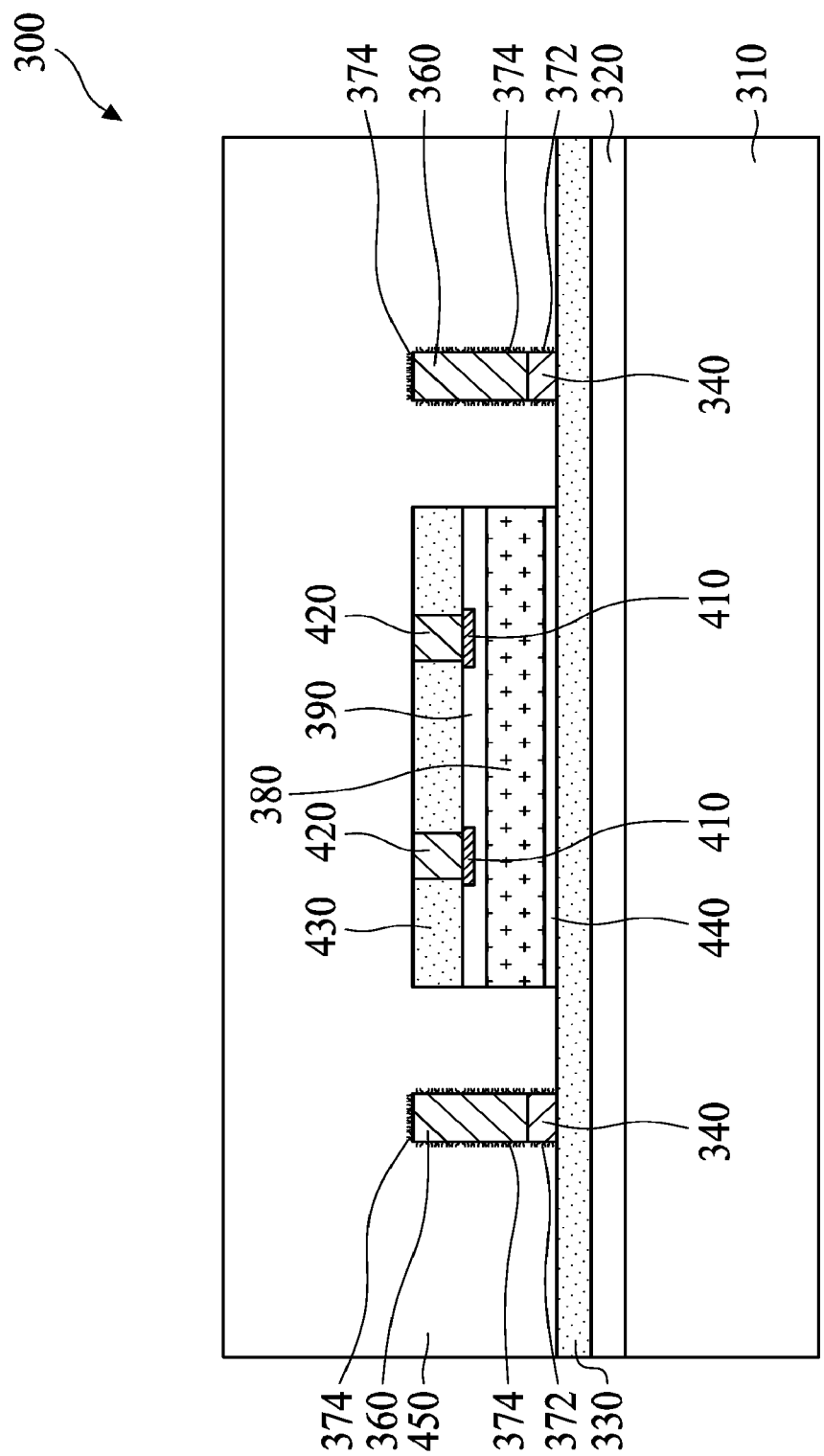
Figure 3H:
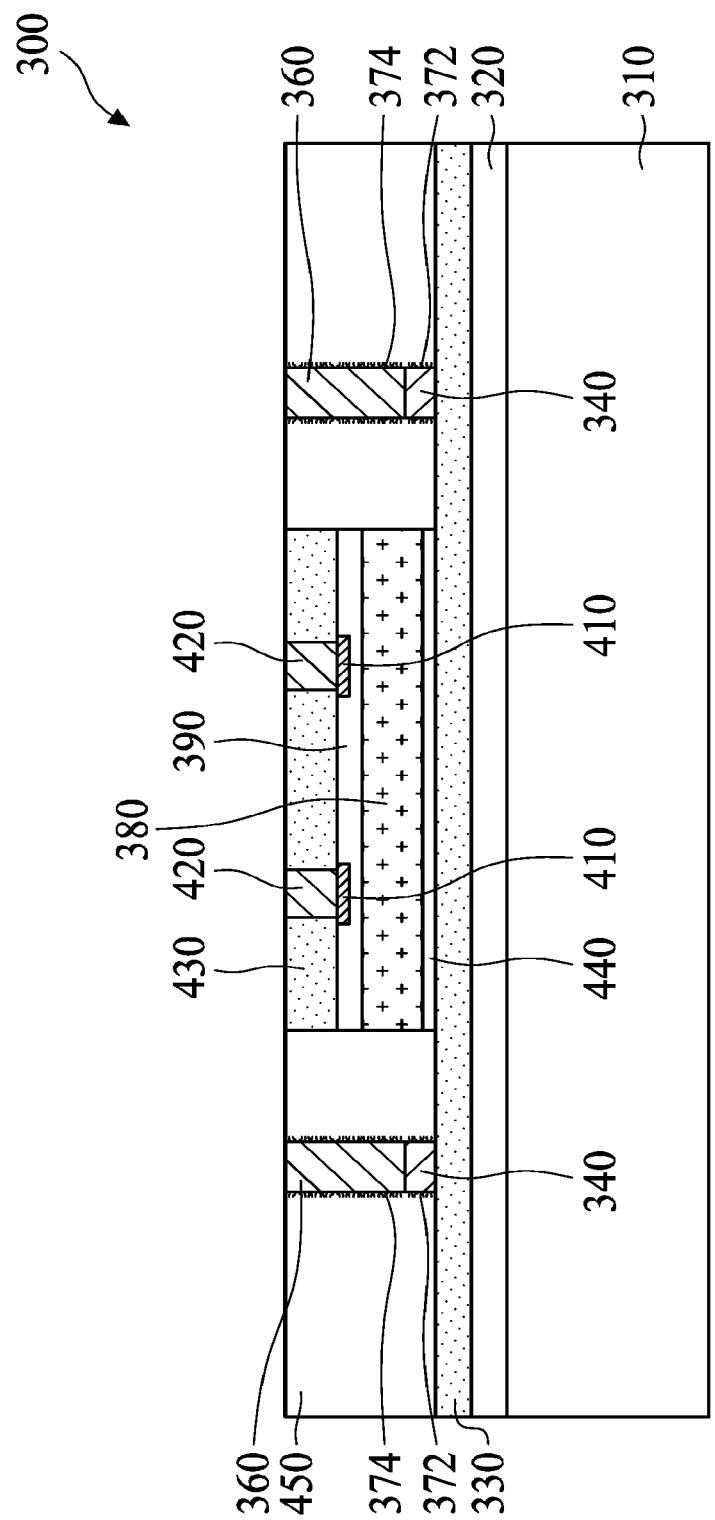
Figure 3I:
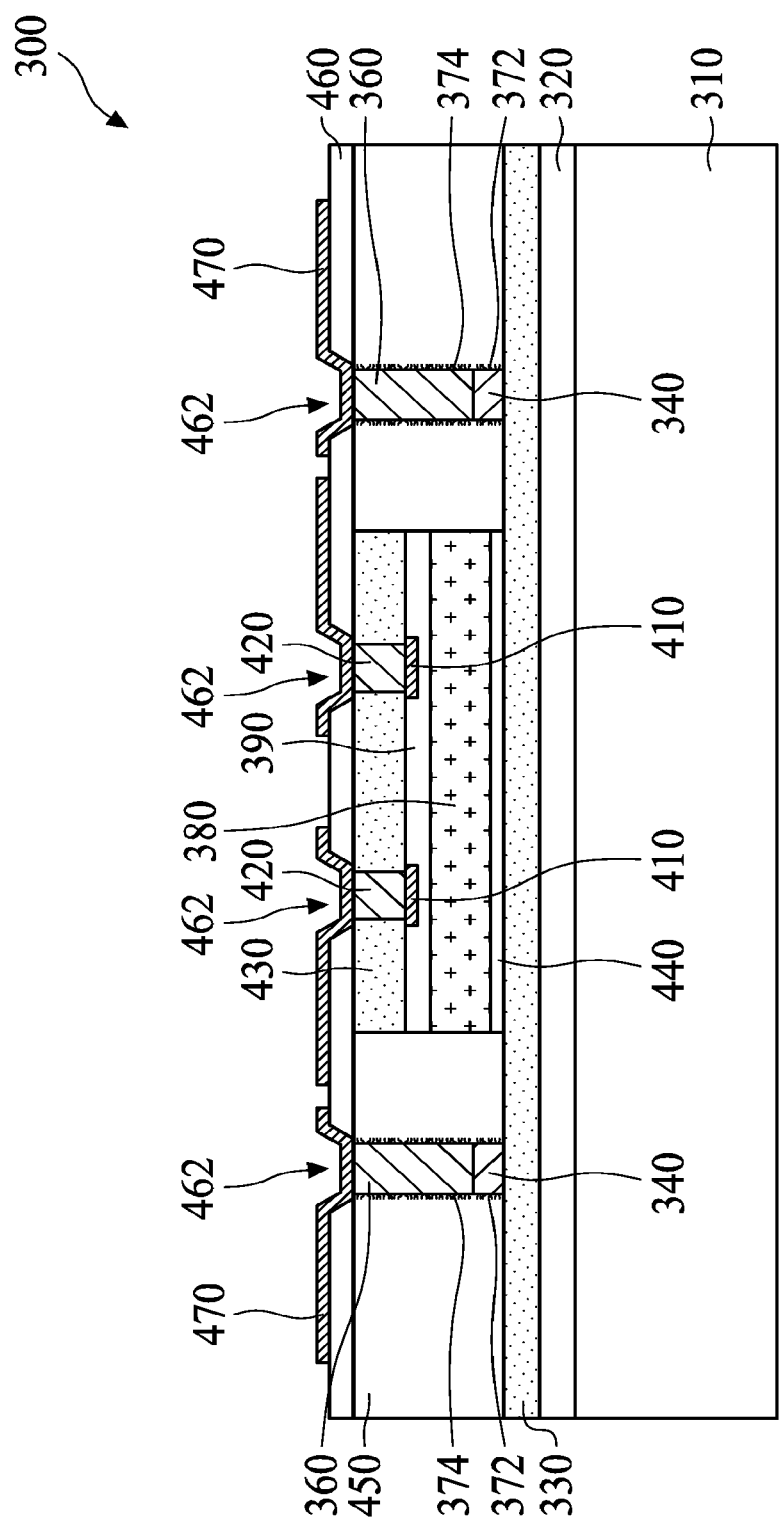
Figure 3J:
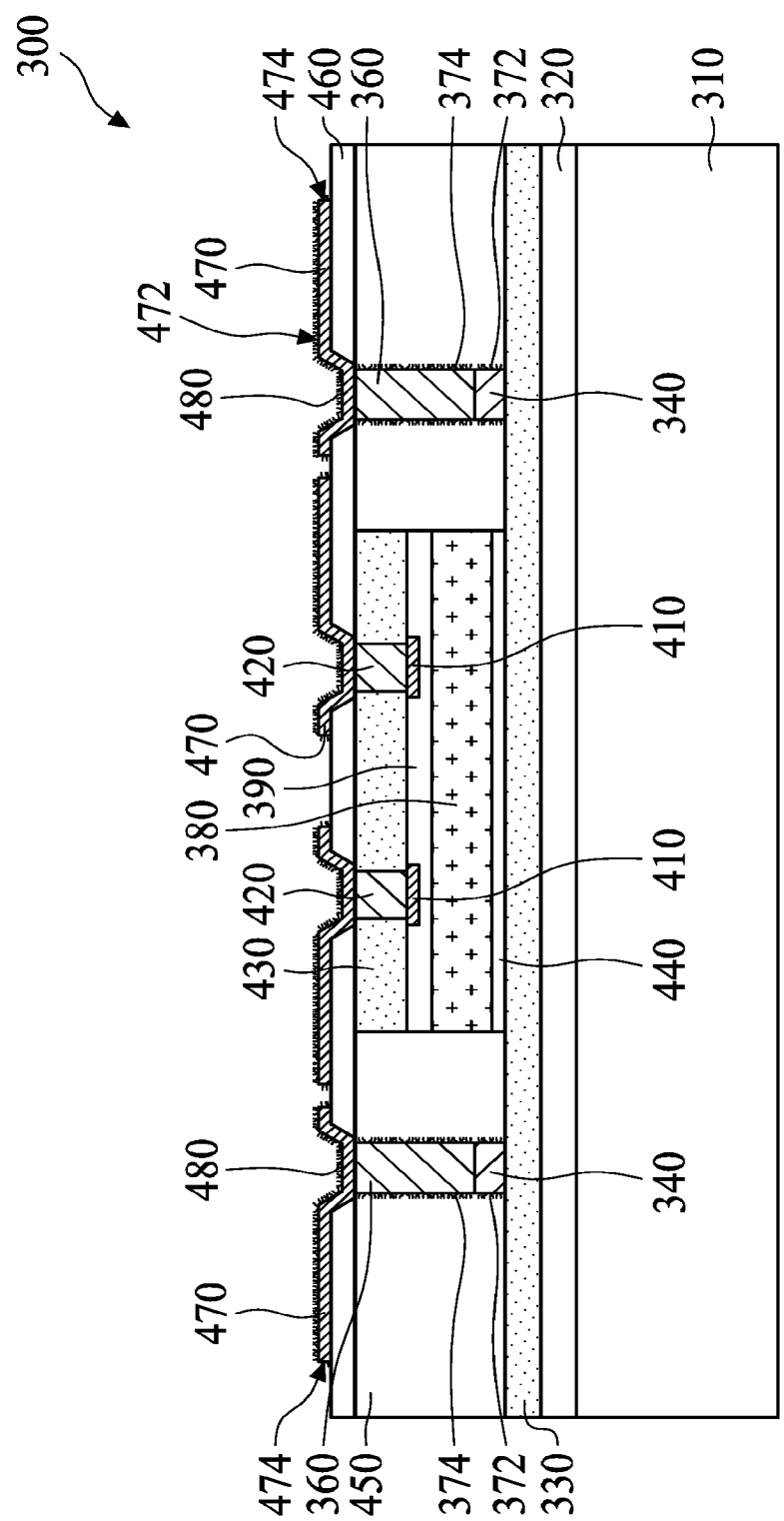
Figure 3K:
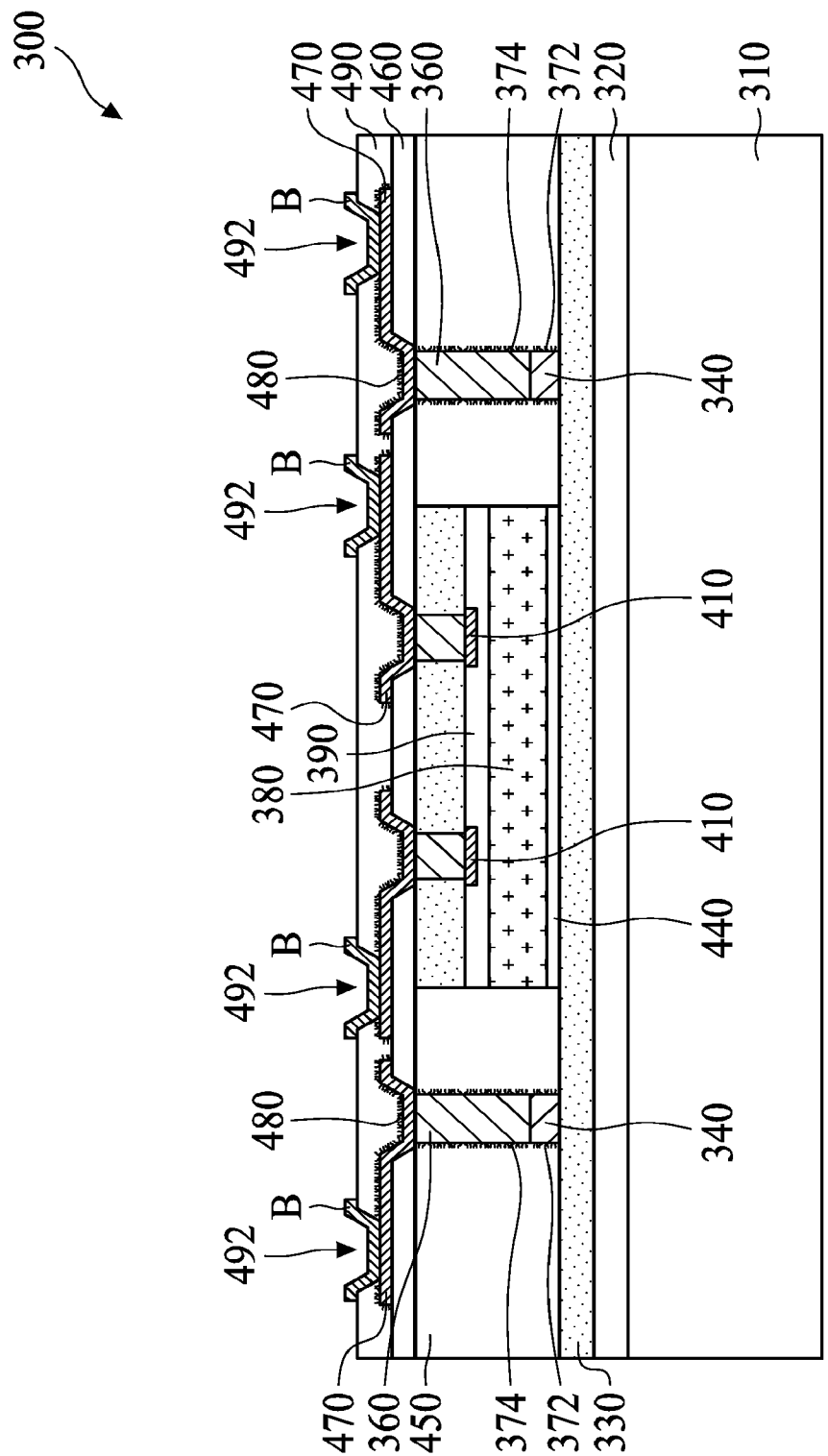
Figure 3L:
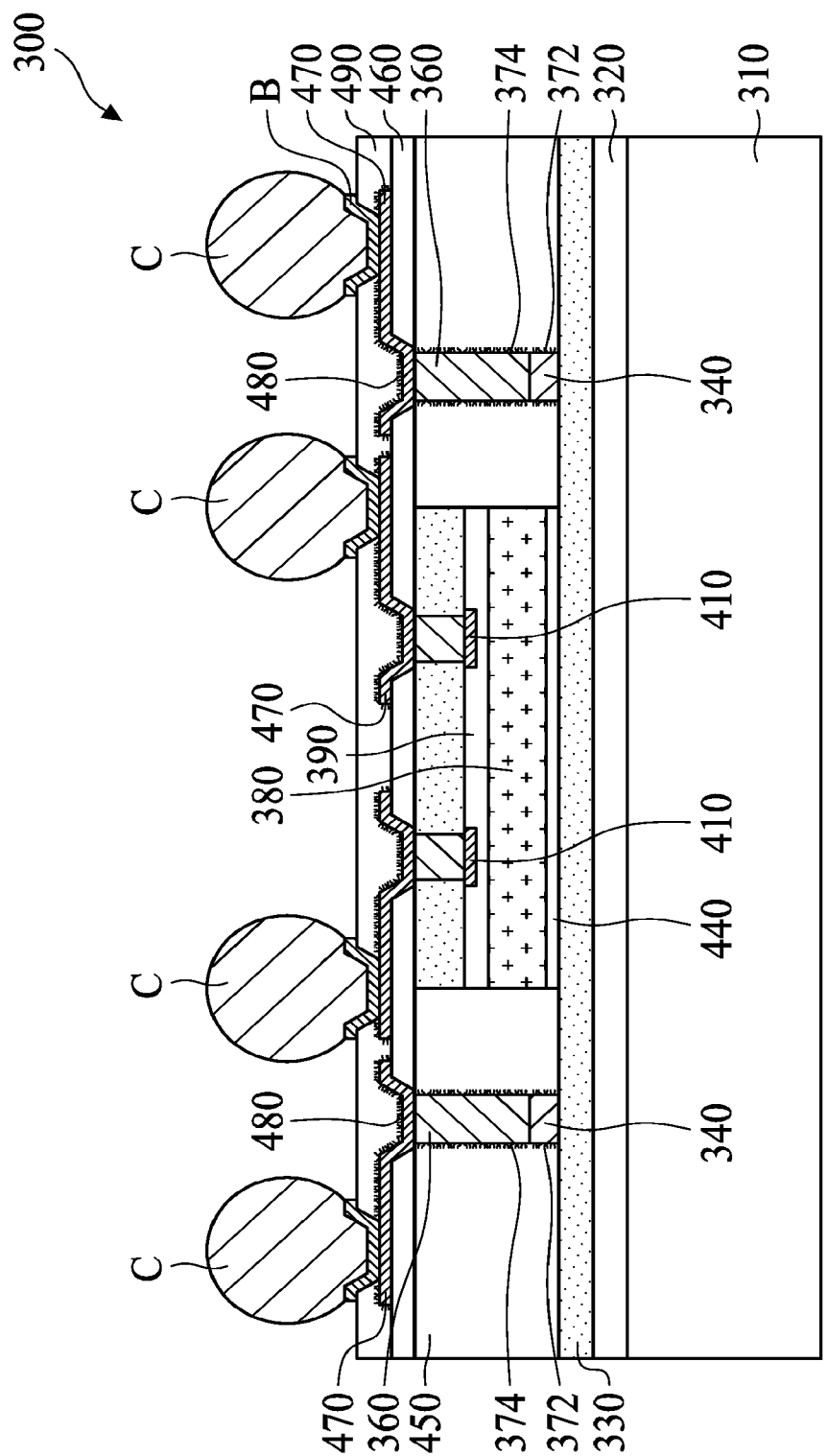
Figure 3M:
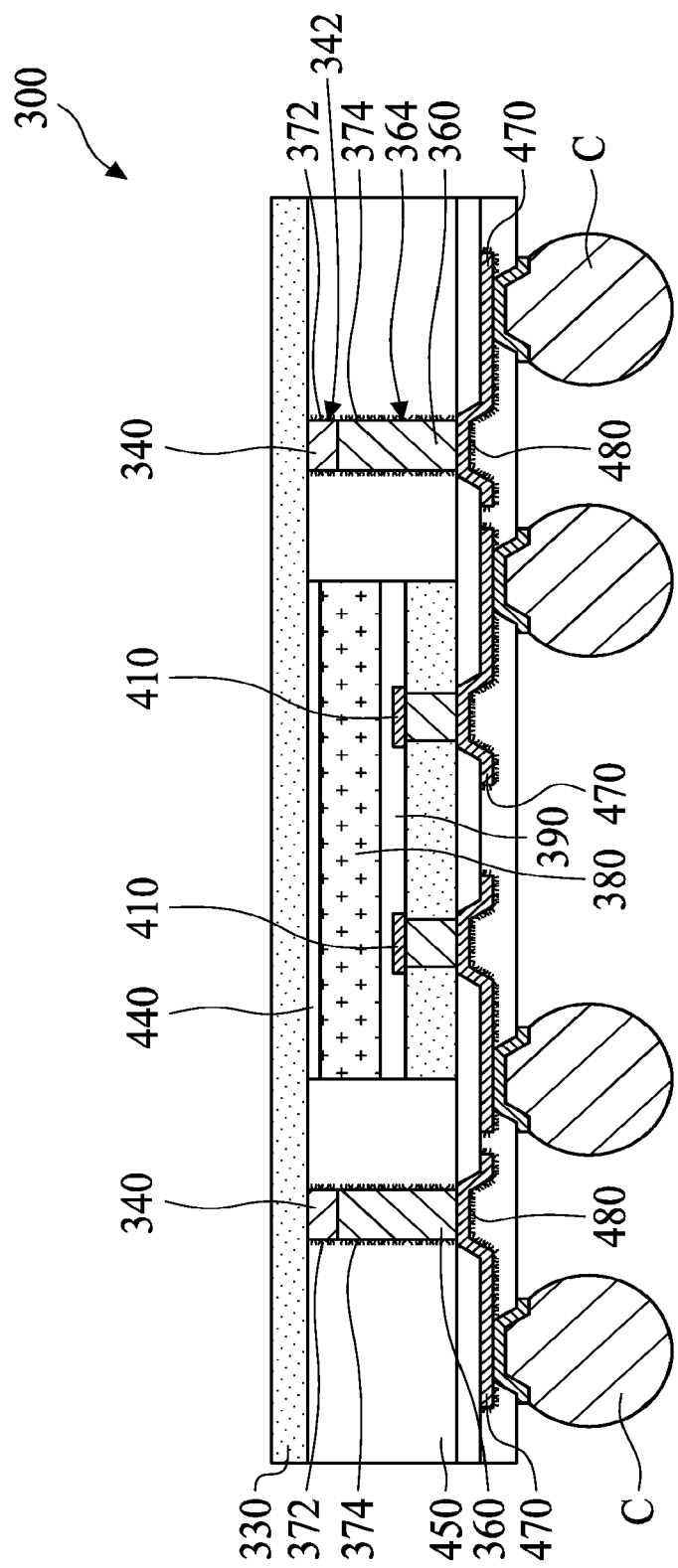
Figure 3N:
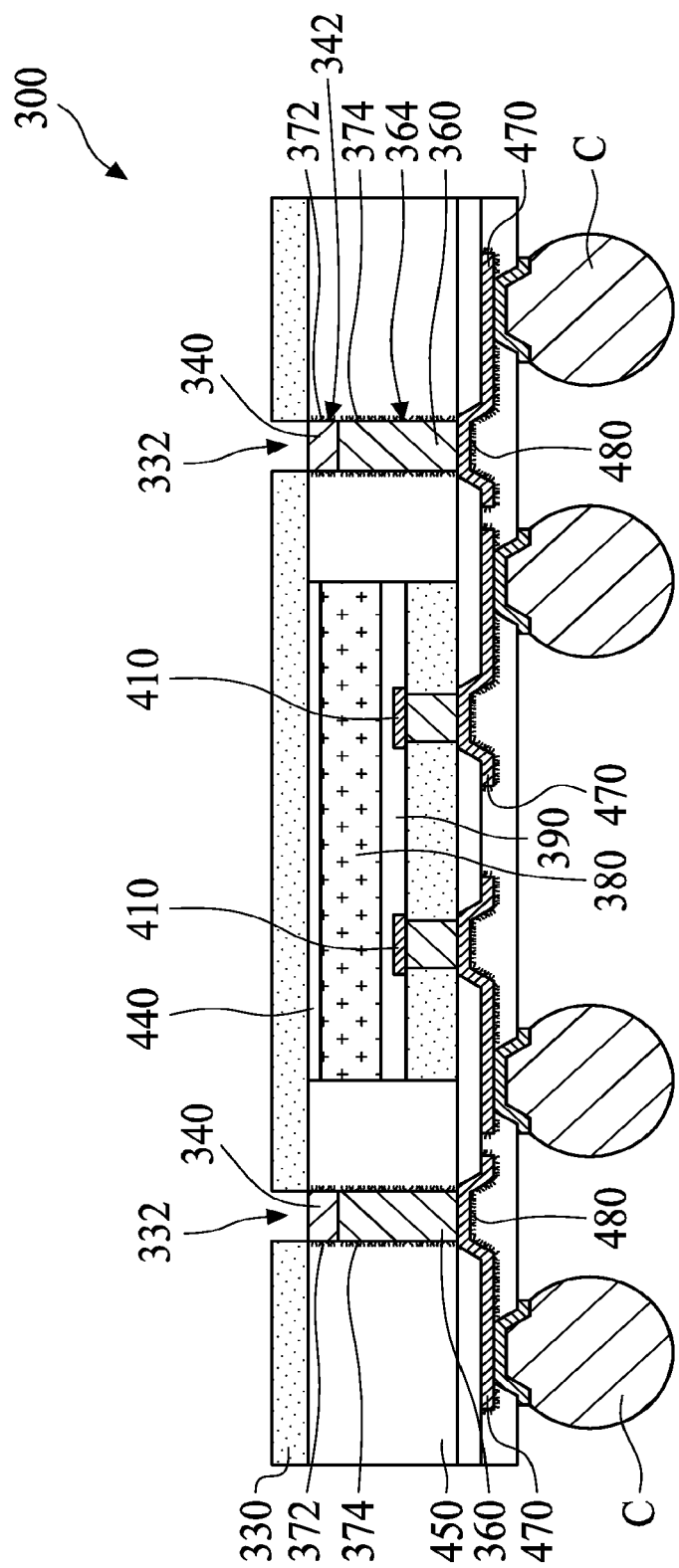
Figure 3O:
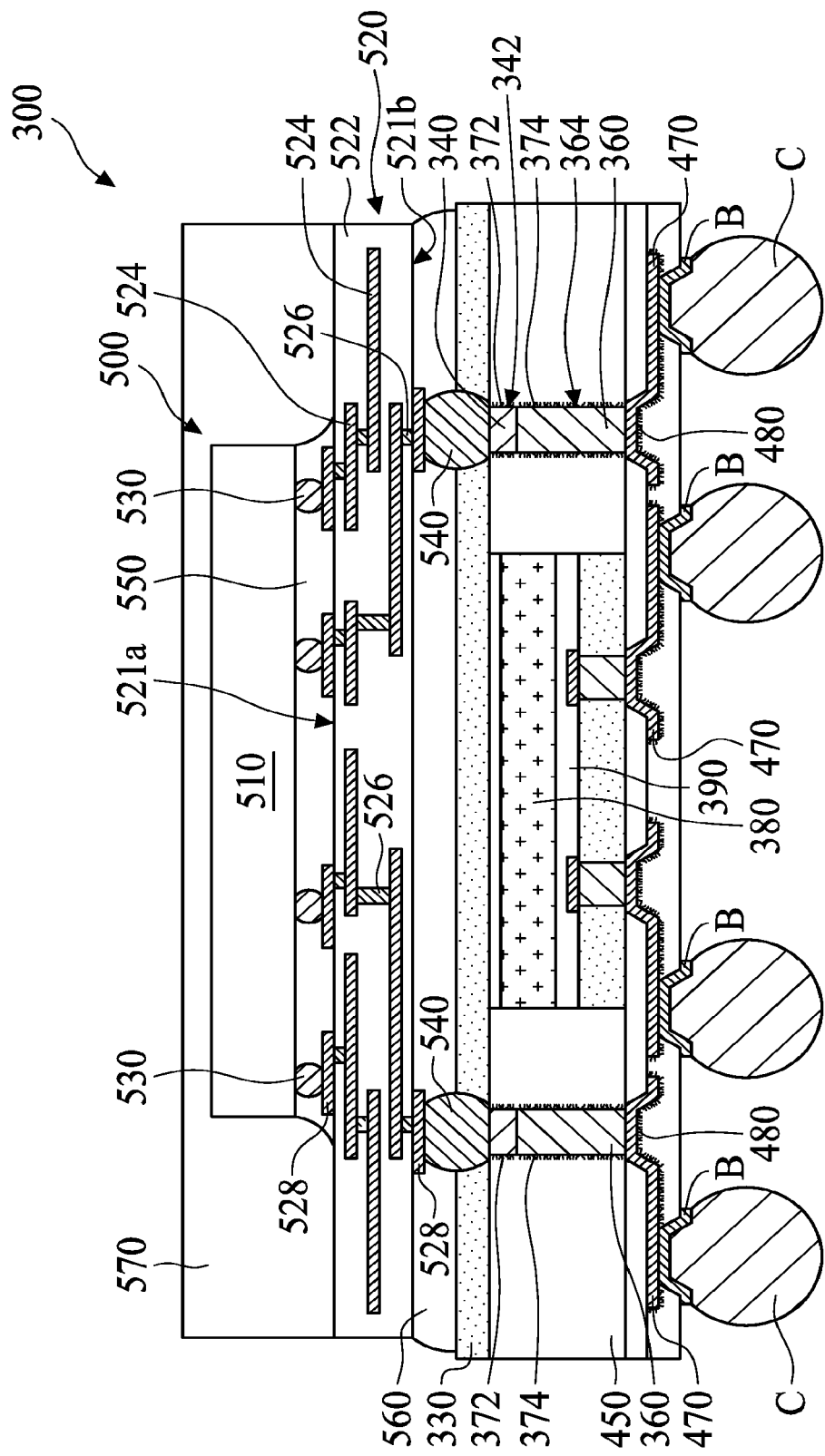

FIGS. 3A-3O are cross-sectional views of various stages of a process for forming a semiconductor device structure 300, in accordance with some embodiments. As shown in FIG. 3A, a carrier substrate 310 is provided, in accordance with some embodiments. The carrier substrate 310 is configured to provide temporary mechanical and structural support during subsequent processing steps, in accordance with some embodiments. The carrier substrate 310 includes glass, silicon oxide, aluminum oxide, a combination thereof, and/or the like, in accordance with some embodiments.

As shown in FIG. 3A, an adhesive layer 320 is formed over the carrier substrate 310, in accordance with some embodiments. The adhesive layer 320 includes any suitable adhesive material, such as an ultraviolet (UV) glue, which loses its adhesive property when exposed to UV lights, in accordance with some embodiments. The adhesive layer 320 is formed using a lamination process, a spin coating process, or another suitable process.

As shown in FIG. 3A, a protective layer 330 is formed over the adhesive layer 320, in accordance with some embodiments. The protective layer 330 is configured to provide structural support for bonding and help reduce die shift and ball cracking issues during subsequent process, in accordance with some embodiments. The protective layer 330 includes a polymer material, such as polybenzoxazole (PBO), polyimide, or epoxy, in accordance with some embodiments. The protective layer 330 is formed using a spin coating process or a chemical vapor deposition process, in accordance with some embodiments.

As shown in FIG. 3A, a conductive layer 340 is formed over the protective layer 330, in accordance with some embodiments. The conductive layer 340 includes copper or another suitable conductive material. The conductive layer 340 is formed using a physical vapor deposition process or a chemical vapor deposition process, in accordance with some embodiments.

As shown in FIG. 3B, a mask layer 350 is formed, in accordance with some embodiments. The mask layer 350 has through holes 352 exposing portions of the conductive layer 340, in accordance with some embodiments. The mask layer 350 includes a photoresist material or another suitable material.

As shown in FIG. 3C, conductive via structures 360 are formed in the through holes 352, in accordance with some embodiments. The conductive via structures 360 are also referred to as conductive structures, in accordance with some embodiments. The conductive via structures 360 includes copper or another suitable conductive material.

The formation of the conductive via structures 360 includes performing an electroplating process, in accordance with some embodiments. In some other embodiments, the conductive layer 340 is not formed, and the formation of the conductive via structures 360 includes performing a deposition process and a planarization process.

As shown in FIG. 3D, the mask layer 350 is removed, in accordance with some embodiments. The mask layer 350 is removed by dipping the mask layer 350 in a chemical solution, in accordance with some embodiments. The chemical solution includes, for example, ethyl lactate, anisole, methyl butyl acetate, amyl acetate, cresol novolak resin, and/or diazo photoactive compound.

As shown in FIG. 3D, the conductive layer 340 exposed by the conductive via structures 360 is removed, in accordance with some embodiments. The removal process includes a wet etching process or a dry etching process, in accordance with some embodiments.

As shown in FIG. 3E, metal oxide fibers 372 and 374 are formed over the conductive layer 340 and the conductive via structures 360 respectively, in accordance with some embodiments. The metal oxide fibers 372 are formed over the sidewalls 342 of the conductive layer 340, in accordance with some embodiments.

The metal oxide fibers 374 are formed over the top surface 362 and the sidewalls 364 of the conductive via structures 360, in accordance with some embodiments. The metal oxide fibers 374 are not formed between the conductive layer 340 and the conductive via structures 360, in accordance with some embodiments.

Each of the metal oxide fibers 372 has an end portion 372a directly connected to the conductive layer 340, in accordance with some embodiments. The metal oxide fibers 372 are in direct contact with the conductive layer 340, in accordance with some embodiments. Each of the metal oxide fibers 374 has an end portion 374a directly connected to the conductive via structures 360, in accordance with some embodiments. The metal oxide fibers 374 are in direct contact with the conductive via structures 360, in accordance with some embodiments.

In some embodiments, two adjacent metal oxide fibers 372 and 374 are in direct contact with each other. The conductive layer 340 includes a metal material (e.g., copper), and the metal oxide fibers 372 are made of an oxide of the metal material (e.g., copper oxide), in accordance with some embodiments. The conductive via structures 360 includes a metal material (e.g., copper), and the metal oxide fibers 374 are made of an oxide of the metal material (e.g., copper oxide), in accordance with some embodiments.

The formation of the metal oxide fibers 372 and 374 includes oxidizing superficial portions of the conductive layer 340 and the conductive via structures 360, in accordance with some embodiments. The superficial portion of the conductive layer 340 is adjacent to the sidewalls 342, in accordance with some embodiments.

The superficial portions of the conductive via structures 360 are adjacent to the top surfaces 362 and the sidewalls 364 of the conductive via structures 360, in accordance with some embodiments. The oxidization process of the superficial portions includes performing a thermal oxidation process or a chemical oxidation process on the superficial portions of the conductive layer 340 and the conductive via structures 360, in accordance with some embodiments.

The chemical oxidation process uses an oxidation solution (e.g., $H_2O_2$), in accordance with some embodiments. The chemical oxidation process includes dipping the conductive layer 340 and the conductive via structures 360 into the oxidation solution, in accordance with some embodiments. The thermal oxidation process is performed in an oxygen-containing environment, in accordance with some embodiments.

As shown in FIG. 3F, a chip 380 is provided, in accordance with some embodiments. The chip 380 is also referred to as a semiconductor substrate, in accordance with some embodiments. As shown in FIG. 3F, a dielectric layer 390 is formed over the chip 380, in accordance with some embodiments. As shown in FIG. 3F, bonding pads 410 are formed in the dielectric layer 390, in accordance with some embodiments. The bonding pads 410 are electrically connected to devices (not shown) formed in/over the chip 380, in accordance with some embodiments.

As shown in FIG. 3F, interconnection structures 420 are formed over the bonding pads 410 respectively, in accordance with some embodiments. The interconnection structures 420 include conductive pillars or conductive bumps, in accordance with some embodiments.

As shown in FIG. 3F, a dielectric layer 430 is formed over the dielectric layer 390 and surrounds the interconnection structures 420, in accordance with some embodiments. As shown in FIG. 3F, the chip 380 is disposed over the protective layer 330, in accordance with some embodiments. As shown in FIG. 3F, an adhesive layer 440 is positioned between the protective layer 330 and the chip 380 to bond the chip 380 to the protective layer 330, in accordance with some embodiments.

As shown in FIG. 3G, a molding compound layer 450 is formed over the protective layer 330 to cover the conductive layer 340, the conductive via structures 360, the metal oxide fibers 372 and 374, the interconnection structures 420, the dielectric layers 390 and 430, the adhesive layer 440, and the chip 380, in accordance with some embodiments.

The metal oxide fibers 372 and 374 penetrate into the molding compound layer 450, in accordance with some embodiments. The molding compound layer 450 includes a polymer material, in accordance with some embodiments. The molding compound layer 450 is formed using a molding process, in accordance with some embodiments.

As shown in FIG. 3H, top portions of the molding compound layer 450, the conductive via structures 360, and portions of the metal oxide fibers 374 are removed, in accordance with some embodiments. The removal process includes a chemical mechanical polishing process, in accordance with some embodiments. After the removal process, the molding compound layer 450 surrounds the chip 380, in accordance with some embodiments.

As shown in FIG. 3I, a dielectric layer 460 is formed over the molding compound layer 450 and the dielectric layer 430, in accordance with some embodiments. The dielectric layer 460 has openings 462 exposing the conductive via structures 360 and the interconnection structures 420, in accordance with some embodiments.

As shown in FIG. 3I, a conductive layer 470 is formed over the dielectric layer 460 and extends into the openings 462 to electrically connect with the conductive via structures 360 and the interconnection structures 420, in accordance with some embodiments. The conductive layer 470 includes a wiring layer and conductive via structures, in accordance with some embodiments. The conductive layer 470 is also referred to as a conductive structure, in accordance with some embodiments. The conductive layer 470 includes copper or another suitable conductive material, in accordance with some embodiments.

As shown in FIG. 3J, metal oxide fibers 480 are formed over the conductive layer 470, in accordance with some embodiments. The metal oxide fibers 480 are also referred to as nano-metal oxide fibers, in accordance with some embodiments. The metal oxide fibers 480 are formed over the top surface 472 and the sidewalls 474 of the conductive layer 470, in accordance with some embodiments. The metal oxide fibers 480 are not formed between the conductive layer 470 and the dielectric layer 460 thereunder, in accordance with some embodiments.

The conductive layer 470 includes a metal material (e.g., copper), and the metal oxide fibers 480 are made of an oxide of the metal material (e.g., copper oxide), in accordance with some embodiments. The formation of the metal oxide fibers 480 includes oxidizing a superficial portion of the conductive layer 470, in accordance with some embodiments. The oxidization process of the superficial portion includes performing a thermal oxidation process or a chemical oxidation process on the superficial portion of the conductive layer 470, in accordance with some embodiments.

As shown in FIG. 3K, a dielectric layer 490 is formed over the dielectric layer 460, in accordance with some embodiments. The dielectric layer 490 has openings 492 exposing portions of the conductive layer 470, in accordance with some embodiments. As shown in FIG. 3K, bonding pads B are formed over the dielectric layer 490 and extend into the openings 492 to electrically connect with the conductive layer 470, in accordance with some embodiments. The bonding pads B include copper, aluminum, tungsten, nickel, palladium, gold, or another suitable conductive material.

As shown in FIG. 3L, conductive bumps C are formed over the bonding pads B respectively, in accordance with some embodiments. The conductive bumps C include tin (Sn) or another suitable material, in accordance with some embodiments. The formation of the conductive bumps C includes forming a solder paste over the bonding pads B and reflowing the solder paste, in accordance with some embodiments.

During the reflow process, the metal oxide fibers 372 are able to prevent delamination between the conductive layer 340 and the molding compound layer 450 resulting from the coefficient of thermal expansion mismatch between the conductive layer 340 and the molding compound layer 450, in accordance with some embodiments.

Similarly, the metal oxide fibers 374 are able to prevent delamination between the conductive via structures 360 and the molding compound layer 450 resulting from the coefficient of thermal expansion mismatch between the conductive via structures 360 and the molding compound layer 450, in accordance with some embodiments.

The metal oxide fibers 480 are able to prevent delamination between the conductive layer 470 and the dielectric layer 490 resulting from the coefficient of thermal expansion mismatch between the conductive layer 470 and the dielectric layer 490, in accordance with some embodiments.

As shown in FIG. 3M, the chip 380 is flipped upside down, in accordance with some embodiments. As shown in FIG. 3M, the carrier substrate 310 and the adhesive layer 320 are removed, in accordance with some embodiments. As shown in FIG. 3N, portions of the protective layer 330 are removed to form openings 332 in the protective layer 330, in accordance with some embodiments. The openings 332 expose the conductive layer 340, in accordance with some embodiments. The removal process includes a photolithography process and an etching process, in accordance with some embodiments.

As shown in FIG. 3O, a chip package 500 is disposed over the chip 380 and the molding compound layer 450 to bond with the conductive layer 340, in accordance with some embodiments. The chip package 500 includes a chip 510, a circuit substrate 520, conductive bumps 530 and 540, and an underfill layer 550, in accordance with some embodiments. The chip 510 is disposed over the circuit substrate 520, in accordance with some embodiments. The chip 510 is bonded to the circuit substrate 520 through the conductive bumps 530 therebetween, in accordance with some embodiments.

The circuit substrate 520 includes a composite dielectric layer 522, wiring layers 524, conductive via structures 526, and bonding pads 528, in accordance with some embodiments. The composite dielectric layer 522 has dielectric layers stacked with each other, in accordance with some embodiments. The wiring layers 524 and the conductive via structures 526 are embedded in the composite dielectric layer 522, in accordance with some embodiments.

The bonding pads 528 are formed over two opposite surfaces 521a and 521b of the circuit substrate 520, in accordance with some embodiments. The conductive via structures 526 electrically connect between the wiring layers 524 or electrically connect the wiring layers 524 to the bonding pads 528, in accordance with some embodiments. The conductive bumps 530 connect the chip 510 to the bonding pads 528, in accordance with some embodiments.

The underfill layer 550 is filled between the chip 510 and the circuit substrate 520, in accordance with some embodiments. The underfill layer 550 includes a polymer material, in accordance with some embodiments. The conductive bumps 540 connect the bonding pads 528 to the conductive layer 340, in accordance with some embodiments. As shown in FIG. 3O, an underfill layer 560 is filled between the circuit substrate 520 and the protective layer 330, in accordance with some embodiments. The underfill layer 560 includes a polymer material, in accordance with some embodiments.

As shown in FIG. 3O, a molding compound layer 570 is molded over the chip 510 and the circuit substrate 520, in accordance with some embodiments. The molding compound layer 570 is configured to protect the chip 510 from damage and contamination during subsequent processes, in accordance with some embodiments. The molding compound layer 570 includes a polymer material, in accordance with some embodiments. There is no metal oxide fiber formed over the bonding pads B, in accordance with some embodiments.

Figure 4:
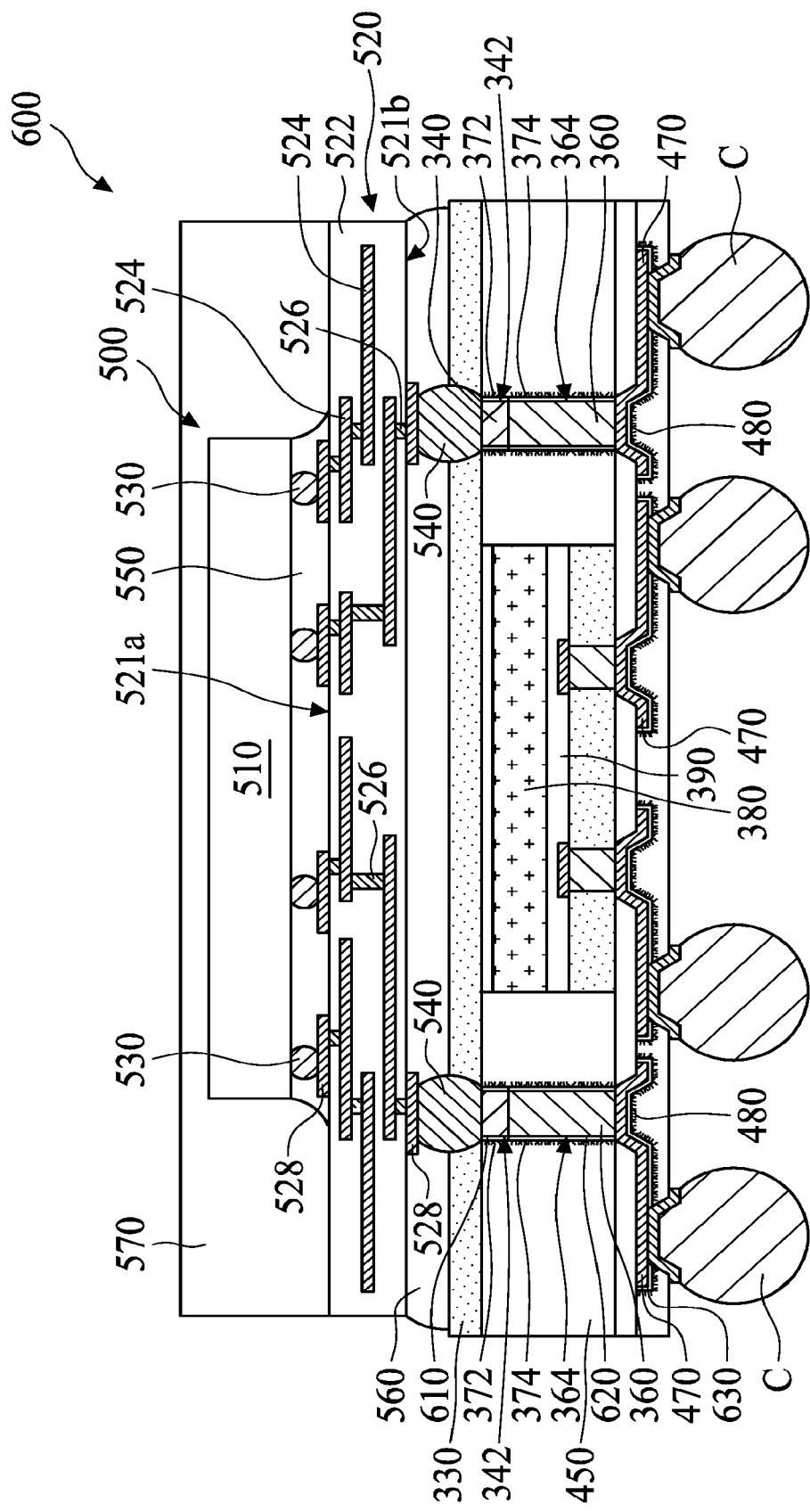
FIG. 4 is a cross-sectional view of a semiconductor device structure, in accordance with some embodiments.

FIG. 4 is a cross-sectional view of a semiconductor device structure 600, in accordance with some embodiments. The semiconductor device structure 600 is similar to the semiconductor device structure 300 of FIG. 3O, except that the semiconductor device structure 600 further includes metal oxide layers 610, 620, and 630, in accordance with some embodiments.

As shown in FIG. 4, the metal oxide layer 610 is formed over the sidewalls 342 of the conductive layer 340, in accordance with some embodiments. The metal oxide fibers 372 are connected to the metal oxide layer 610, in accordance with some embodiments. The metal oxide fibers 372 and the metal oxide layer 610 are made of the same material, in accordance with some embodiments. The metal oxide layer 620 is formed over the sidewalls 364 of the conductive via structures 360, in accordance with some embodiments.

The metal oxide fibers 374 are connected to the metal oxide layer 620, in accordance with some embodiments. The metal oxide fibers 374 and the metal oxide layer 620 are made of the same material, in accordance with some embodiments. The metal oxide layer 630 is formed over the conductive layer 470, in accordance with some embodiments. The metal oxide fibers 480 are connected to the metal oxide layer 630, in accordance with some embodiments. The metal oxide fibers 480 and the metal oxide layer 630 are made of the same material, in accordance with some embodiments.

In accordance with some embodiments, semiconductor device structures and methods for forming the same are provided. The methods (for forming the semiconductor device structure) form metal oxide fibers over a conductive structure to connect the conductive structure to a dielectric layer, which covers the conductive structure and the metal oxide fibers. Therefore, the metal oxide fibers prevent delamination between the conductive structure and the dielectric layer. As a result, the yield and the reliability of the semiconductor device structures are improved.

In accordance with some embodiments, a semiconductor device structure is provided. The semiconductor device structure includes a substrate. The semiconductor device structure includes a conductive structure over the substrate. The semiconductor device structure includes first metal oxide fibers over the conductive structure. The semiconductor device structure includes a dielectric layer over the substrate and covering the conductive structure and the first metal oxide fibers. The dielectric layer fills gaps between the first metal oxide fibers.

In accordance with some embodiments, a semiconductor device structure is provided. The semiconductor device structure includes a substrate. The semiconductor device structure includes a first conductive structure over the substrate. The semiconductor device structure includes a metal oxide layer over the first conductive structure. The semiconductor device structure includes first metal oxide fibers connected to the metal oxide layer. The first metal oxide fibers and the metal oxide layer are made of a same material. The semiconductor device structure includes a dielectric layer over the substrate and covering the first conductive structure, the metal oxide layer, and the first metal oxide fibers.

In accordance with some embodiments, a method for forming a semiconductor device structure is provided. The method includes forming a conductive structure over a substrate. The method includes forming a plurality of first metal oxide fibers over the conductive structure. The method includes forming a dielectric layer over the substrate to cover the conductive structure and the first metal oxide fibers. The dielectric layer fills gaps between the first metal oxide fibers.

One general aspect of embodiments disclosed herein includes a semiconductor device structure, including: a substrate. The semiconductor device structure also includes a conductive structure over the substrate. The semiconductor device structure also includes a dielectric layer over the substrate; and a plurality of metal oxide fibers extending from the conductive structure and penetrating the dielectric layer.

Another general aspect of embodiments disclosed herein includes a device including: an integrated circuit die; a molding compound encapsulating the integrated circuit die; a conductive via including a metal extending through the molding compound and being adjacent the integrated circuit die; and a plurality of fibers including an oxide of the metal, extending from the conductive via into the molding compound.

Yet another general aspect of embodiments disclosed herein includes a method for forming a semiconductor device structure, including: forming a conductive structure. The method also includes oxidizing an outer surface of the conductive structure to form a plurality of first metal oxide fibers extending outward from the outer surface. The method also includes encapsulating the plurality of metal oxide fibers in a dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
    forming a via structure over a carrier;
    forming first oxide fibers on sidewalls and on an upper surface of the via structure;
    attaching a die to the carrier adjacent to the via structure; and
    forming a molding material over the carrier around the via structure and the die, the first oxide fibers extending away from the via structure into the molding material.

2. The method of claim 1, further comprising:
    performing a planarization process to recess the molding material, wherein the planarization process removes the first oxide fibers disposed on the upper surface of the via structure;
    forming a conductive structure over the molding material, the conductive structure electrically coupled to the via structure; and
    forming second oxide fibers on an upper surface of the conductive structure facing away from the die.

3. The method of claim 2, further comprising:
    forming a bonding pad over and electrically coupled to the conductive structure, the bonding pad being free of oxide fibers; and
    forming an external connector on the bonding pad.

4. The method of claim 2, further comprising removing the carrier.

5. The method of claim 1, further comprising before forming the first oxide fibers, forming an oxide layer on the sidewalls and on the upper surface of the via structure.

6. The method of claim 2, further comprising:
    before forming the first oxide fibers, forming a first oxide layer on the sidewalls and on the upper surface of the via structure; and
    before forming the second oxide fibers, forming a second oxide layer on the upper surface of the conductive structure.

7. The method of claim 1, wherein the via structure is formed of a metal, and the first oxide fibers are formed of an oxide of the metal.

8. The method of claim 7, wherein the metal is copper, and the oxide of the metal is copper oxide.

9. The method of claim 7, wherein forming the first oxide fibers comprises performing a thermal oxidization process.

10. The method of claim 7, wherein forming the first oxide fibers comprises dipping the via structure in an oxidation solution.

11. The method of claim 10, wherein the oxidization solution is hydrogen peroxide.

12. A method for forming a semiconductor device, the method comprising:
    forming a via structure over a carrier;
    forming first oxide fibers on sidewalls and on an upper surface of the via structure;
    attaching a die to the carrier adjacent to the via structure;
    forming a molding material over the carrier around the via structure and the die, the first oxide fibers extending away from the via structure into the molding material;
    forming a conductive structure over the molding material, the conductive structure electrically coupled to the via structure;
    forming second oxide fibers on an upper surface of the conductive structure facing away from the molding material; and
    forming a dielectric layer over the molding material around the conductive structure, the second oxide fibers extending into the dielectric layer.

13. The method of claim 12, wherein the molding material is formed to cover the upper surface of the via structure and an upper surface of the die, wherein the method further comprises, after forming the molding material and before forming the conductive structure, performing a planarization process to achieve a coplanar upper surface between the via structure, the die, and the molding material, wherein the planarization process removes the first oxide fibers disposed on the upper surface of the via structure.

14. The method of claim 12, wherein a lower surface of the conductive structure facing the molding material is free of oxide fibers.

15. The method of claim 12, wherein forming the first oxide fibers comprises performing an oxidization process to oxidize an exterior portion of the via structure.

16. The method of claim 15, wherein the oxidization process is a thermal oxidization process.

17. The method of claim 15, wherein the oxidization process is a chemical oxidization process performed using an oxidization solution.

18. A method for forming a semiconductor device, the method comprising:
    forming a via structure over a carrier;
    forming first oxide fibers on sidewalls and on an upper surface of the via structure;
    attaching a die to the carrier adjacent to the via structure;
    forming a molding material over the carrier around the via structure and the die, the first oxide fibers extending away from the via structure into the molding material;
    recessing the molding material to expose the via structure and to expose the die, the recessing removing the first oxide fibers disposed on the upper surface of the via structure;

forming a conductive structure over the recessed molding material, the conductive structure electrically coupled to the via structure;

forming second oxide fibers on an upper surface of the conductive structure facing away from the molding material, an opposing lower surface of the conductive structure being free of oxide fibers; and forming a first dielectric layer over the molding material around the conductive structure, the second oxide fibers extending into the first dielectric layer.

19. The method of claim 18, further comprising before forming the conductive structure, forming a second dielectric layer over the molding material, wherein the conductive structure is formed at least partially over the second dielectric layer, and a portion of the conductive structure extends through the second dielectric layer to electrically couple to the via structure.

20. The method of claim 18, wherein the via structure is formed of a metal, wherein forming the first oxide fibers comprises oxidizing an exterior portion of the via structure.

* * * * *